(12) United States Patent
Wang et al.

(10) Patent No.: US 11,070,197 B1
(45) Date of Patent: Jul. 20, 2021

(54) METHODS AND APPARATUS FOR TRANSISTOR HEALTH MONITORING

(71) Applicant: Texas Instruments Incorporated, Dallas, TX (US)

(72) Inventors: Gangyao Wang, Cary, NC (US); Rajarshi Mukhopadhyay, Allen, TX (US); Miguel Aguirre, Lucas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/731,474

(22) Filed: Dec. 31, 2019

(51) Int. Cl.
*H03K 3/011* (2006.01)
*H03K 17/687* (2006.01)
*H03M 1/12* (2006.01)

(52) U.S. Cl.
CPC ........... *H03K 3/011* (2013.01); *H03K 17/687* (2013.01); *H03M 1/12* (2013.01)

(58) Field of Classification Search
CPC ........ H03K 3/011; H03K 17/687; H03M 1/12
USPC .................................................. 327/108–112
See application file for complete search history.

(56) References Cited

U.S. PATENT DOCUMENTS

2018/0102773 A1* 4/2018 Li ...................... G01R 31/2621

OTHER PUBLICATIONS

Y. Avenas, L. Dupont, N. Baker, H. Zara and F. Barruel, "Condition Monitoring: A Decade of Proposed Techniques," in IEEE Industrial Electronics Magazine, vol. 9, No. 4, pp. 22-36, Dec. 2015 (15 pages).

R. Ouaida et al., "Gate Oxide Degradation of SiC MOSFET in Switching Conditions," in IEEE Electron Device Letters, vol. 35, No. 12, pp. 1284-1286, Dec. 2014 (3 pages).
J. R. Celaya, A. Saxena, V. Vashchenko, S. Saha, and K. Goebel,"Prognostics of Power MOSFET," in Proc. IEEE International Symposium on Power Semiconductor Devices and ICs, pp. 160-163, May 23-26, 2011 (4 pages).
F. Stella, G. Pellegrino, E. Armando and D. Daprà, "On-line temperature estimation of SiC power MOSFET modules through on-state resistance mapping," 2017 IEEE Energy Conversion Congress and Exposition (ECCE), Cincinnati, OH, 2017, pp. 5907-5914 (8 pages).

* cited by examiner

*Primary Examiner* — Tomi Skibinski
(74) *Attorney, Agent, or Firm* — Mark A. Valetti; Charles A. Brill; Frank D. Cimino

(57) ABSTRACT

Methods, apparatus, systems and articles of manufacture are described for transistor health monitoring. An example gate driver includes a request receiver pin, a measurement transmitter pin, and a driver control logic pin, the request receiver pin, the measurement transmitter pin, and the driver control logic pin configured to be coupled to a controller, a sensing pin, the sensing pin to be coupled to a sensing circuit, a control logic circuit having an input coupled to the request receiver pin, a transistor coupled to the control logic circuit and the sensing pin, a multiplexer coupled to the control logic circuit and the sensing pin, an analog-to-digital converter (ADC) coupled to the multiplexer and the measurement transmitter pin, and a driver control logic circuit coupled to the driver control logic pin.

25 Claims, 8 Drawing Sheets

METHODS AND APPARATUS FOR TRANSISTOR HEALTH MONITORING

FIELD OF THE DISCLOSURE

This disclosure relates generally to drivers for switching devices and, more particularly, to methods and apparatus for transistor health monitoring.

BACKGROUND

A field-effect transistor (FET) is an electronic device that uses an electric field to control the flow of current. FETs are three-terminal devices, having a source, gate, and drain terminal; multiple FETs can be connected in parallel and packaged as a power module. The flow of current from the source to the drain of the FET is controlled by a voltage applied to the gate terminal, which alters the conductivity between the drain and source terminals. A FET device also typically includes an intrinsic body diode that allows current to flow from the source to the drain in certain conditions. Modern FET devices are relatively robust, especially when operated within the temperature and electrical limitations defined by the manufacturer. However, both the FET and the body diode can degrade as power is delivered through the device which can reduce the reliability of the device over time.

DETAILED DESCRIPTION

Figure 1:
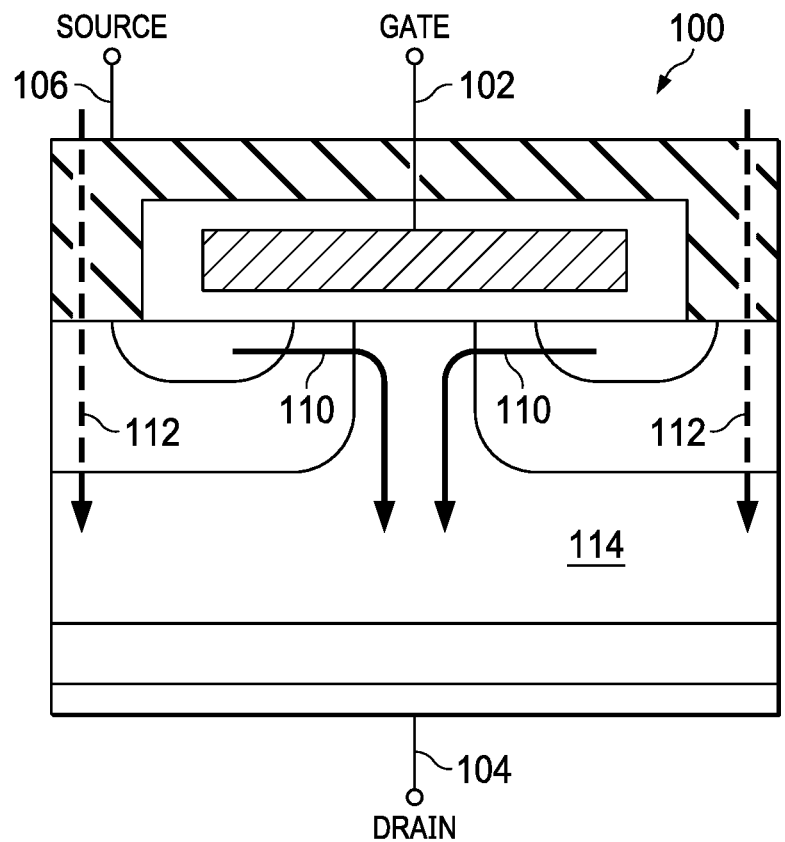
FIG. 1 depicts a schematic illustration of a transistor.

The figures are not to scale. Instead, the thickness of the layers or regions may be enlarged in the drawings. In general, the same reference numbers will be used throughout the drawing(s) and accompanying written description to refer to the same or like parts. Connecting lines or connectors shown in the various figures presented are intended to represent example functional relationships and/or physical or logical couplings between the various elements.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the described examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

Typical field-effect transistor (FET) devices, such as metal-oxide-semiconductor field-effect transistor (MOSFET) devices, are relatively reliable and/or robust devices, especially when operated within the temperature and electrical limitations defined by a manufacturer of the FET devices. A FET device also typically includes an intrinsic body diode that allows current to flow from the source to the drain in certain conditions. A control circuit (e.g., a controller, a gate driver, a processor, etc.) may control operation of a FET by applying (1) a first drive signal to a gate of the FET to facilitate current flow through a channel of the FET or (2) a second drive signal to facilitate current flow through a body diode of the FET. The control circuit may also be configured to monitor a voltage measured across the FET (e.g., a source-to-drain voltage, a drain-to-source voltage, a gate-to-source voltage, etc.) in response to the respective drive signals. However, both the FET and the body diode can degrade as power is delivered through the FET (e.g., through the channel, through the body diode, etc., of the FET). The degradation of the FET can reduce the reliability of the FET over time. In some described examples, the FET can experience extrinsic degradation, or package degradation (e.g., package-related degradation). In such described examples, FET package degradation can correspond to a degradation, a destruction, a damaging, etc., of one or more bond wires, one or more conductor pads, etc., of the FET package. In some described examples, the FET can experience intrinsic degradation, or die degradation (e.g., die-related degradation). In such described examples, FET die degradation can correspond to gate-oxide degradation, electromigration, and/or hot-carrier injection associated with the die of the FET.

Gate drivers may measure different FET parameters such as a source-to-drain voltage (VSD), a drain-to-source voltage (VDS), etc., which can correspond to a drain-to-source on resistance (RDSON) when a gate-to-source voltage (VGS) is sufficiently high to turn on the FET. For example, RDSON can correspond to a ratio of VDS and a drain-to-source current (IDS) (e.g., RDSON=VDS/IDS). RDSON can correspond to a total resistance between a drain and a source in a FET (e.g., a MOSFET) when the FET is on and/or otherwise enabled.

In some instances, a steady value for the RDSON can indicate better health and/or reliability of the FET compared to an increased value for the RDSON. For instance, an increasing value for the RDSON over a period of time can indicate that the FET is degrading and may eventually degrade to failure and inoperability of the FET. In some instances, an increasing value for the RDSON can indicate at least one of die degradation or package degradation. However, using RDSON to determine which particular one(s) of the degradations, if any, are occurring, may be challenging to ascertain.

RDSON is also a function of temperature. For example, RDSON can increase with increasing temperature because a mobility of holes and electrons associated with the FET decrease with increasing temperature. However, analyzing RD SON using typical techniques may be challenging in that the distinction between different types of degradation associated with the FET is not readily ascertainable. For example, utilizing RDSON to determine a health and/or reliability of a FET cannot separate die degradation from package degradation and vice-versa.

Examples described herein provide for transistor health monitoring (e.g., current or instant health monitoring, prognostic, predictive, or future health monitoring, etc.). As a FET degrades over time, a FET voltage measurement (e.g., a source-to-drain voltage, a drain-to-source voltage, etc.) may change with respect to a previously measured FET voltage measurement or other baseline FET voltage measurement. In some described examples, FET voltage measurements are collected as part of a diagnostic phase during startup of the FET to determine an indication of health and/or reliability status of the FET. As each of the first and second drive signals drives current through different paths (e.g., a first current path through a channel of the FET, a second current path through the intrinsic body diode of the FET, etc.) of the FET, each of the respective measured voltages can provide a signature representative of a respective health attribute for the FET. For example, the FET voltage measurement measured in response to the first drive signal (e.g., causing current through the FET channel) can provide a first signature indicative of FET die degradation and FET package degradation (e.g., one or more bond wires or conductor pads of the FET may be degrading). In other examples, the FET voltage measurement measured in response to the second drive signal (e.g., causing current through the body diode) may provide a second signature indicative of FET die degradation when source-to-drain bias current is low.

In some described examples, a gate driver is configured to be coupled to a desaturation (DESAT) circuit, such as a DESAT fault detection circuit. A DESAT circuit can provide protection for power semiconductor switches (e.g., insulated-gate bipolar transistors (IGBTs), MOSFETS, etc.) against short-circuit current events that may lead to destruction of these switches. A DESAT circuit can include a voltage measurement circuit that can measure a voltage associated with a FET, such as a drain-to-source voltage of the FET.

In some described examples, a gate driver measures the FET voltage using the DESAT circuit. For example, in response to either of the first drive signal or the second drive signal controlling the FET, the gate driver can generate a DESAT sense current to bias a diode of the DESAT circuit to measure a drain-to-source voltage associated with the FET. In such examples, the gate driver can transmit the drain-to-source voltage to a controller to compare against a previously measured drain-to-source voltage or other baseline voltage measurement. The comparison allows for health evaluation of the FET.

In some described examples, the controller can determine that the FET has a remaining operation lifetime below a desired remaining operation lifetime. For example, the controller can compare the FET voltage measurement to a degradation threshold and determine whether the FET voltage measurement meets the degradation threshold based on the comparison. In some described examples, in response to determining that the FET voltage measurement does not meet the degradation threshold, the controller can determine that the FET may experience a potential failure. In such described examples, the controller can generate an alert to facilitate a shutdown of the FET and/or the gate driver or provide an indication that repair and/or replacement of the FET may be needed to improve system health and/or reliability. In other examples, the controller can generate the alert to include a message (e.g., a message to be displayed on a user interface, a message to be audibly presented via one or more audio speakers, etc.) that the FET requires maintenance, replacement, etc., and/or a combination thereof.

FIG. 1 depicts a schematic illustration of an example transistor 100. In FIG. 1, the transistor 100 is a FET device (e.g., a power FET, a MOSFET, a silicon carbide (SiC) FET, etc.) including example terminals 102, 104, 106. The terminals 102, 104, 106 include an example gate (e.g., a control terminal, a gate terminal, etc.) 102, an example drain (e.g., a current terminal, a drain terminal, etc.) 104, and an example source (e.g., a current terminal, a source terminal, etc.) 106. For example, the terminals 102, 104, 106 can be constructed and/or otherwise be composed of aluminum, copper, etc., or any other conductive material. FIG. 1 depicts different example current paths (e.g., current flow paths) 110, 112 through the transistor 100 including a first example current path 110 (through the FET channel) and a second example current path 112 (through the FET body diode).

In the illustrated example of FIG. 1, current flows through the transistor 100 based on a voltage (e.g., a voltage potential) applied to the gate 102. For example, in response to applying a first voltage to the gate 102 causing a gate-to-source (VGS) voltage of the transistor 100 to be high (e.g., substantially high, a voltage in a range of 15-20 volts, etc.), current flows through an example channel of the transistor 100 as illustrated by the first current path 110. In other examples, in response to applying a second voltage to the gate 102 causing a VGS voltage of the transistor 100 to be negative, current flows through an alternate internal path through an example body diode (e.g., an intrinsic body diode) 114 of the transistor 100 as illustrated by the second current path 112.

In the illustrated example of FIG. 1, when VGS is high, current flows through the channel via the first current path 110. When VGS is negative, current flows through the body diode 114 of the transistor 100. As demonstrated in examples described herein, two separate voltage signatures—a first voltage signature based on positive high bias (e.g., VGS is in a range of 15-20 volts) and a second voltage signature based on negative bias (e.g., VGS is negative and/or otherwise less than zero volts)—can be measured and/or otherwise obtained.

The first voltage signature can represent and/or otherwise be indicative of intrinsic degradation (e.g., die or die related degradation) and extrinsic degradation (e.g., package or package related degradation). For example, intrinsic degradation can correspond to hot carrier injection, electromigration, and/or gate-oxide degradation occurring because of operating stresses. Intrinsic degradation can occur when current flows according to the first current path 110 because current is flowing through a die of the transistor 100. In other examples, extrinsic degradation can correspond to aluminum reconstruction, bond wire fatigue (e.g., cracking of a bond wire, lifting off of a bond wire, etc.), solder joint fatigue (e.g., void formation, delamination, etc.). In some examples, the first voltage signature and/or the second voltage signature can be measured and analyzed with respect to a degradation threshold to determine an indication of reliability of the transistor 100.

Figure 2:
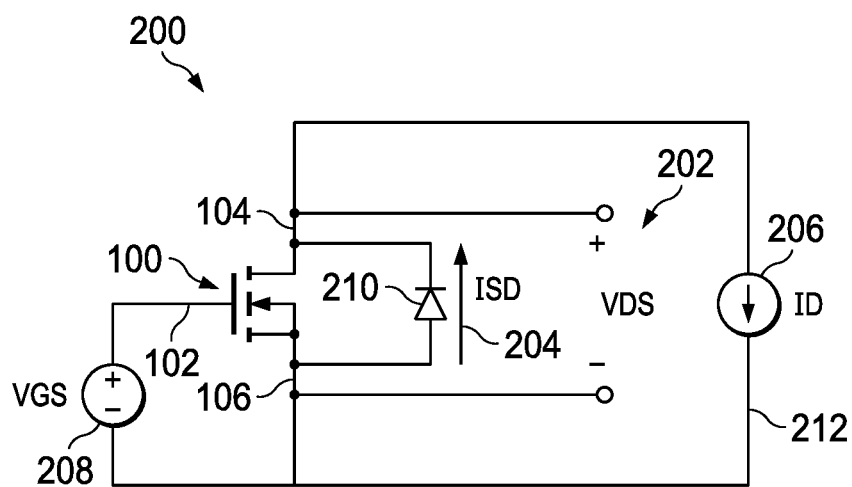
FIG. 2 depicts a schematic illustration of a circuit including the transistor of FIG. 1.

FIG. 2 depicts a schematic illustration of an example circuit 200 including the transistor 100 of FIG. 1. FIG. 2 depicts a drain-to-source voltage (VDS) 202 and a source-to-drain current (ISD) 204. For example, VDS 202 can be measured in examples described herein. In FIG. 2, depending on the polarity of voltage source 208, ID 206 flows through either a channel of the transistor 100 or a body diode 210 of the transistor 100. The voltage source 208 of FIG. 2 corresponds to VGS, or a voltage difference between a first voltage at the gate 102 and a second voltage at a ground or reference rail 212. In FIG. 2, ID 206 is represented as a current source that sources current determined by an external system circuit.

Figure 3:
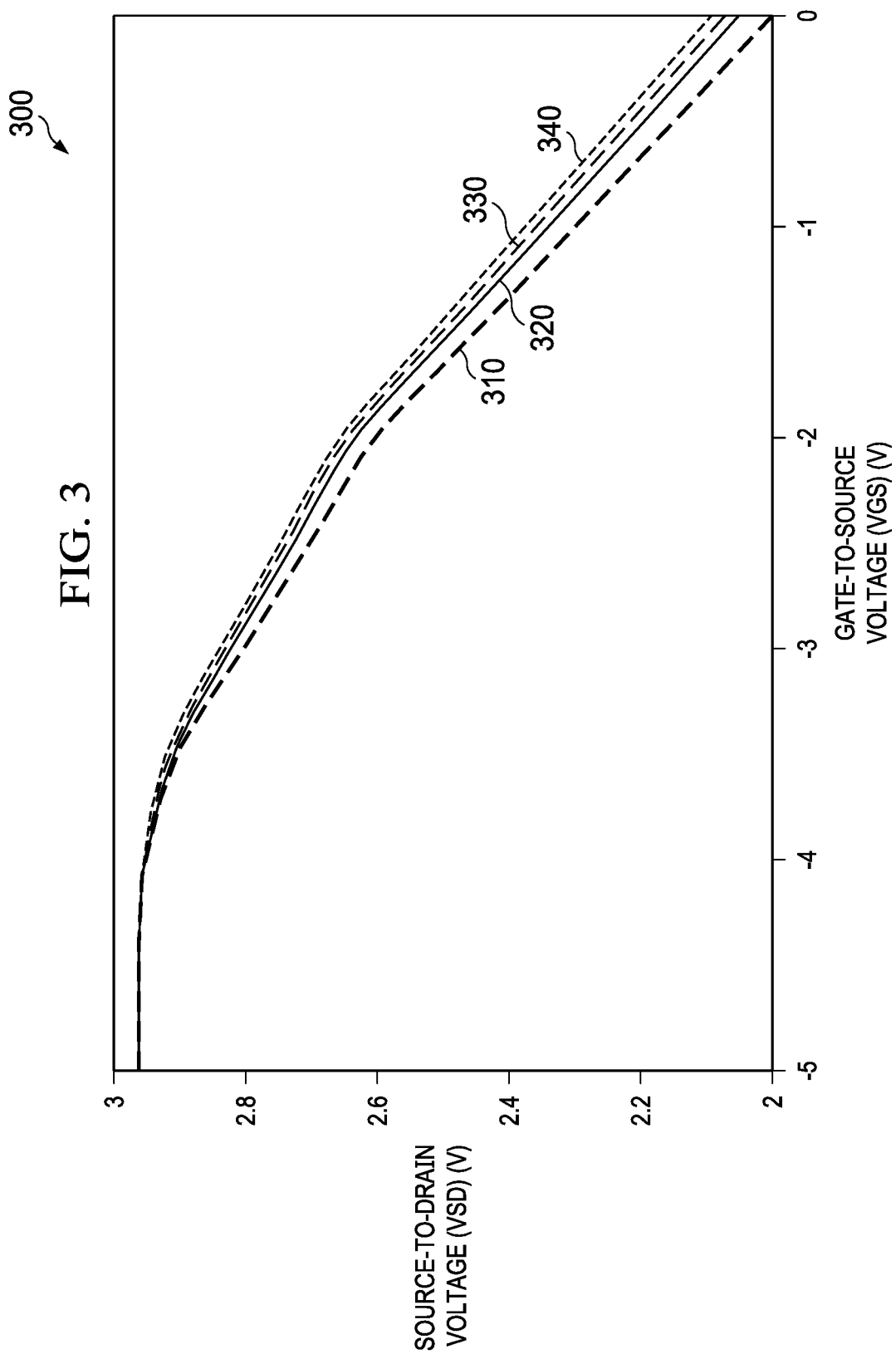
FIG. 3 depicts a graph illustrating a relationship between a gate-to-source voltage and a source-to-drain voltage of the transistor of FIG. 1 when there is source-to-drain current bias in reverse-conduction mode.

FIG. 3 depicts an example graph 300 illustrating a relationship between VGS and VSD of the transistor 100 of FIG. 1. For example, the graph 300 can be representative of VGS and VSD of the transistor 100 when the transistor 100 is in reverse-conduction mode. The graph 300 depicts example effects of gate biasing on the transistor 100 under different operating conditions. Source-to-drain voltage (VSD) is represented on the vertical axis of the graph 300 in volts (V) and gate-to-source voltage (VGS) is represented on the horizontal axis of the graph 300 in volts (V).

In FIG. 3, the graph 300 includes a plurality of example curves including a first example curve 310, a second example curve 320, a third example curve 330, and a fourth example curve 340. The first curve 310 represents a relatively new transistor that has been cycled approximately 100 times under load. The second curve 320 represents the same transistor that has been cycled approximately 2000 times under load. The third curve 330 represents the same transistor that has been cycled approximately 5000 times under load. The fourth curve 340 represents the same transistor that has been cycled 10000 times under load.

As mentioned previously with respect to FIGS. 1-2, a FET voltage measurement, such as VSD, of the transistor 100 of FIG. 1 can be measured with 0 V bias for VGS to generate a first signature (e.g., a first voltage signature) or with negative VGS bias to generate a second signature (e.g., a second voltage signature). With 0V VGS bias, ISD 204 of FIG. 2 (e.g., a leakage current) will flow through the channel of FIG. 1 (e.g., the first current path 110 of FIG. 1). Thus, measured VSD at reference ISD 204 can be used as an indicator for package degradation and transistor die degradation. Depicted in the graph 300 of FIG. 3, at 0 V on the horizontal axis for VGS, VSD shifts from 2 V to approximately 2.1 V after 10000 power cycles depicted by the fourth curve 340. A VSD value of 2.1 V can correspond to a signature that the transistor 100 of FIG. 1 may eventually go to thermal runaway. For example, the transistor 100 can undergo thermal runaway if VSD continues to increase (e.g., shift upwards from 2 V, continue to increase in voltage, etc.) beyond some thermal runaway related threshold (e.g., a pre-defined threshold, a degradation threshold, etc.).

In some examples, with enough negative VGS bias (e.g., above some negative threshold), the channel of the transistor 100 can pinch-off, and the ISD 204 of FIG. 2 can traverse through the body diode 210 of FIG. 2 of the transistor 100 (e.g., the second path 112 of FIG. 1). Thus, measured VSD at reference ISD 204 can be used as an indicator for the package degradation. Depicted in the graph 300 of FIG. 3, when VGS is greater than −4 V on the horizontal axis, VSD (vertical-axis) drifts over the illustrated power cycling test shown. Therefore, while VSD is constant in examples where VGS is less than −4 V, constant values for VSD illustrates VSD performance for the second path 112 through the body diode 210 and, thus, does not change due to cycling or a switching operation of the transistor 100.

Figure 4A:
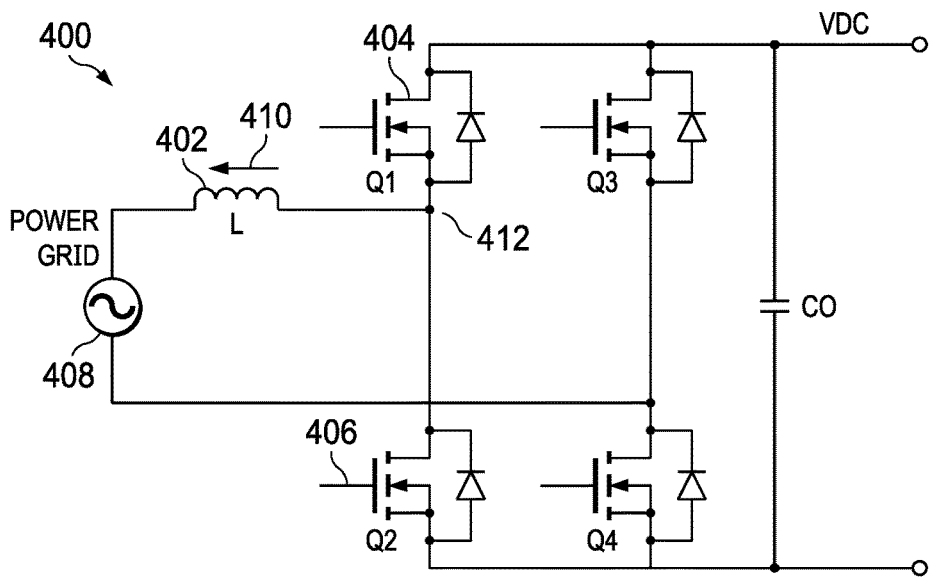
FIG. 4A depicts a schematic illustration of a single phase rectifier circuit including an inductor, a first transistor, and a second transistor.

FIG. 4A depicts a schematic illustration of a single phase rectifier circuit 400 including an inductor 402, a first transistor (Q1) 404, and a second transistor (Q2) 406. In some examples, Q1 404 and/or Q2 406 can correspond to the transistor 100 of FIGS. 1 and/or 2. The single phase rectifier circuit 400 converts alternating current (AC) voltage at an input node corresponding to a power grid 408 to a direct current (DC) voltage (VDC) at an output node (e.g., output voltage terminals coupled to a load).

In the illustrated example of FIG. 4A, the first transistor 404 and the second transistor 406 are N-channel MOSFETs. In FIG. 4A, a first end of the inductor 402 is coupled to the power grid 408 or other voltage source. For example, the power grid 408 can correspond to an AC power source from a commercial or residential wall outlet (e.g., in an electric vehicle charging example). In FIG. 4A, a second end of the inductor 402 is coupled to a source of the first transistor 404 and a drain of the second transistor 406. An inductor current 410 is flowing in a direction depicted by an arrow from an example node 412 to the power grid 408. For example, the inductor current 410 can be negative current corresponding to current flowing through Q1 404 when Q1 404 is in reverse-conduction mode.

In some examples, the power grid 408 is an AC power source in an automobile or vehicle (e.g., an electric vehicle, a hybrid vehicle, etc.). For example, the single phase rectifier circuit 400 can be included in a vehicle that includes one or more rechargeable batteries (e.g., lithium-ion batteries), one or more high-voltage boost converters, one or more traction inverters (e.g., high-voltage traction inverters), one or more motors (e.g., electric motors), etc., and/or a combination thereof. In such examples, the first transistor 404 and the second transistor 406 can switch power from the power grid 408 to a load (e.g., a traction inverter, a motor, etc.). Advantageously, vehicle safety is enhanced by monitoring the degradation of the first transistor 404, the second transistor 406, etc. For example, by detecting whether one(s) of the transistor(s) 404, 406 have begun to degrade, are degraded, etc., an alert can be generated to a user of the vehicle that the one(s) of the transistor(s) 404, 406 are to be replaced with new transistors, a new vehicle electronic control unit (ECU) that includes the transistors 404, 406 can be replaced, etc. In such examples, the degradation monitoring of the transistors 404, 406 can improve overall operation of a multi-phase inverter of a motor of an electric vehicle by preventing damage to the multi-phase inverter, the motor, etc., reducing downtime of the multi-phase inverter, the motor, etc., and/or a combination thereof.

Figure 4B:
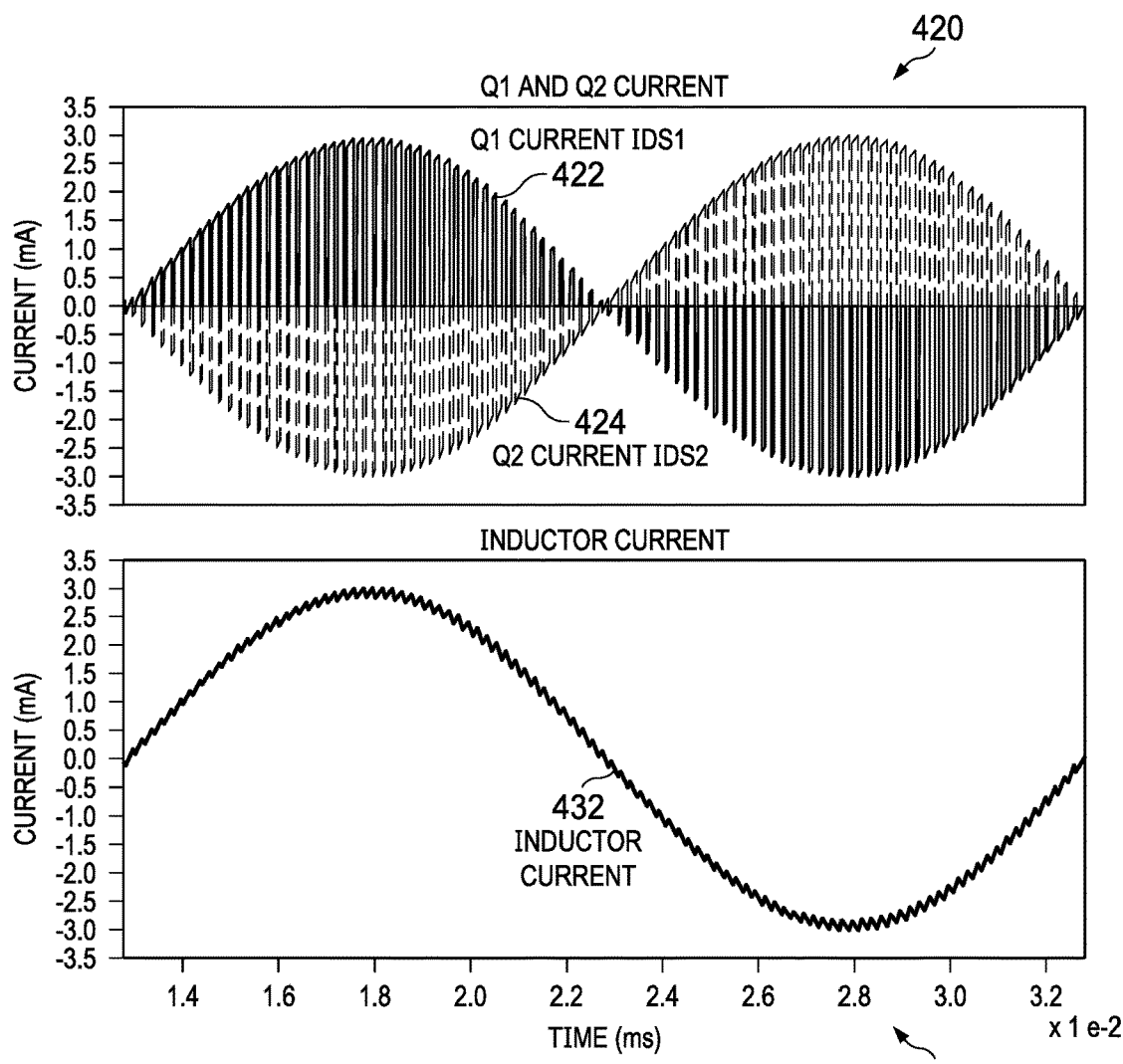
FIG. 4B depicts a first graph of a first drain-to-source current of the first transistor of FIG. 4A and a second drain-to-source current of the second transistor of FIG. 4A and a second graph of an inductor current of the inductor of FIG. 4A.

FIG. 4B depicts a first example graph 420 of a first waveform 422 and a second waveform 424. In FIG. 4B, the first waveform 422 can correspond to a first IDS current (Q1 current IDS1) of the first transistor 404 of FIG. 4A. In FIG. 4B, the second waveform 424 can correspond to a second IDS current (Q2 current IDS2) of the second transistor 406 of FIG. 4A. FIG. 4B depicts a second example graph 430 of a third waveform 432 that can correspond to the inductor current 410 of FIG. 4A. The horizontal axis of the first and second graphs 420, 430 corresponds to time in milliseconds (ms) and the vertical axis of the first and second graphs 420, 430 corresponds to current in amperes (A) or hundreds of amperes.

In the illustrated example of FIG. 4B, the first and second graphs 420, 430 span a power line cycle of the single phase rectifier circuit 400 of FIG. 4A. For example, the first and second graphs 420, 430 can correspond to a power line cycle having a power line frequency of 50 Hz (20 ms).

In the illustrated example of FIG. 4B, each power device current (e.g., IDS1 and IDS2) is negative for half of the power line cycle. In FIG. 4B, IDS2 is negative for half of the power line cycle spanning from approximately 1.3 to 2.3 ms. In FIG. 4B, IDS1 is negative for half of the power line cycle spanning from approximately 2.3 to 3.3 ms.

In some examples, negative power device current can correspond to current flowing through a body diode when a corresponding transistor has negative gate bias. In some examples, negative power device current can correspond to current flowing through a channel (e.g., third quadrant channel current) when a corresponding transistor has positive gate bias. For example, from approximately 1.3 to 2.3 ms in FIG. 4B, the drain-to-source current of Q2 406 can be either 0 or negative. In the example of Q2 406 having a positive gate bias, the negative drain-to-source current can flow through the channel and/or the body diode of Q2 406. In the example of Q2 406 having a negative gate bias, the negative drain-to-source current flows only through the body diode of Q2 406.

Figure 5:
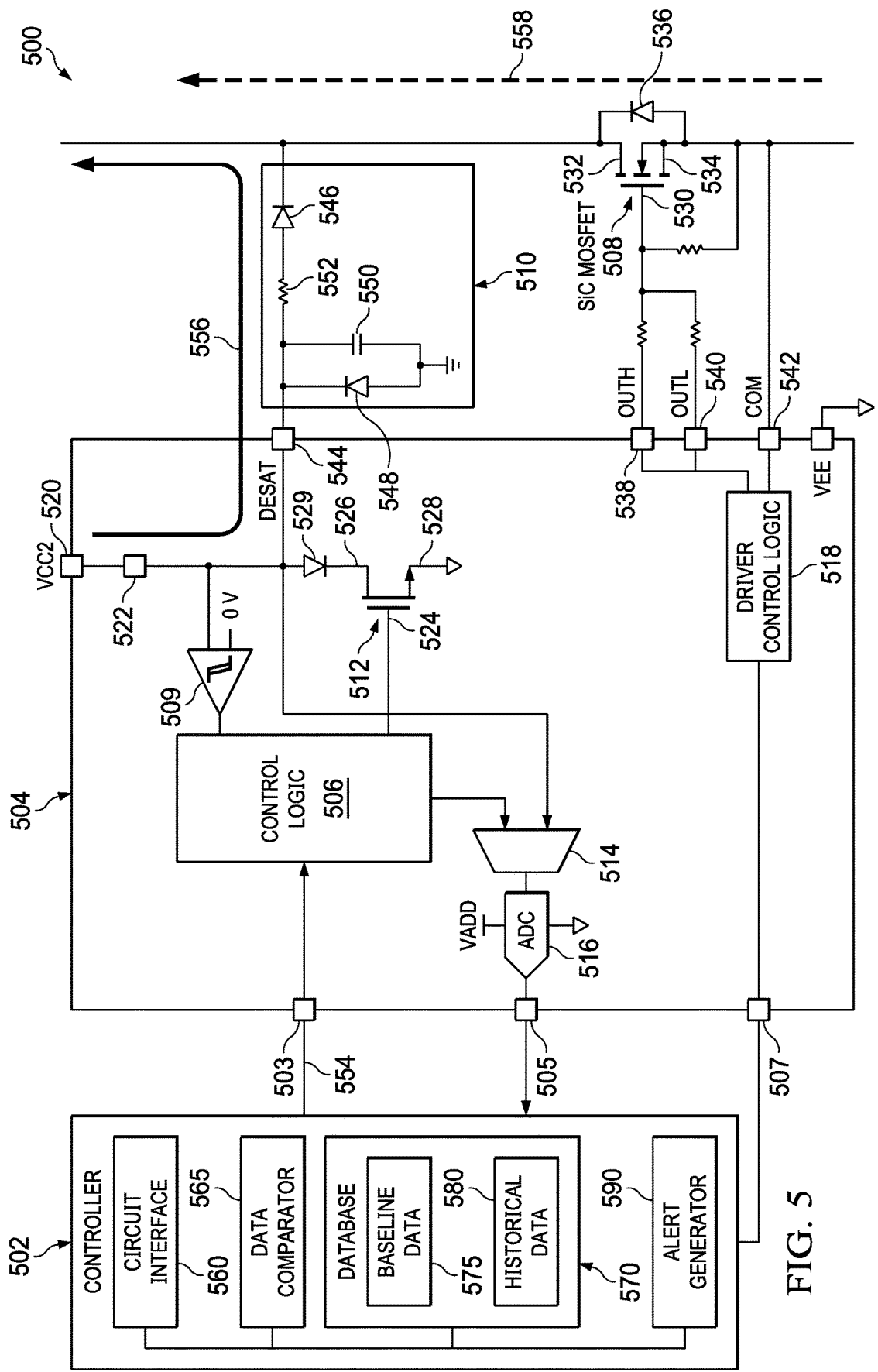
FIG. 5 depicts an example implementation of a gate driver system including a controller, control logic, a transistor, and a sensing circuit to implement the examples described herein.

FIG. 5 depicts an example implementation of a gate driver system 500 including a controller 502, a gate driver 504, control logic 506, and a first transistor 508. In some examples, the gate driver system 500 measures a voltage associated with the first transistor 508 and determines a health and/or reliability of the first transistor 508 based on the voltage. In FIG. 5, the controller 502 is coupled to the gate driver 504 and in a configuration that enables the controller 502 to transmit requests to the gate driver 504 to obtain voltage measurements associated with the first transistor 508.

In the illustrated example of FIG. 5, the controller 502 is coupled to the gate driver 504 via one or more example pins (e.g., controller pins) 503, 505, 507 including a first example pin 503, a second example pin 505, and a third example pin 507. In FIG. 5, the first pin 503, the second pin 505, and the third pin 507 are electrical connections (e.g., integrated circuit (IC) pins, vias, nodes, etc.) of the gate driver 504 to electrically couple with different circuits, devices, etc., such as the controller 502 of FIG. 5. In FIG. 5, the first pin 503 is a request receiver pin configured to receive and/or otherwise obtain requests (e.g., a request for a voltage associated with the first transistor 508) from the controller 502. In FIG. 5, the second pin 505 is a measurement transmitter pin configured to transmit and/or otherwise send a measurement (e.g., a voltage measurement, a digital value corresponding to the voltage measurement, etc.) to the controller 502. In FIG. 5, the third pin 507 is a driver control logic pin configured to receive and/or otherwise obtain commands, control signals, instructions, etc., from the controller 502 to control the driver control logic 518.

In the illustrated example of FIG. 5, the gate driver 504 is coupled to the first transistor 508 and an example desaturation (DESAT) circuit 510. In FIG. 5, the desaturation circuit 510 is a sensing circuit. In FIG. 5, the desaturation circuit 510 is coupled to the first transistor 508 and in a configuration that enables the desaturation circuit 510 to measure a voltage (e.g., a drain-to-source voltage, a source-to-drain voltage, etc.) associated with the first transistor 508. In FIG. 5, the first transistor 508 may implement the second transistor 406 of FIG. 4A. In FIG. 5, the first transistor 508 can be coupled to the first transistor 404 of FIG. 4A in a way that is consistent with the second transistor 406 being coupled to the first transistor 404 in FIG. 4A.

In the illustrated example of FIG. 5, the gate driver system 500 corresponds to one or more integrated circuits (e.g., integrated circuit dies), one or more integrated devices (e.g., packages, integrated circuit packages, etc.), etc. For example, the gate driver system 500 can be an integrated circuit die that includes the controller 502 and the gate driver 504. In other examples, the gate driver system 500 can be an integrated circuit package including two or more integrated circuit dies. In such examples, a first integrated circuit die can include the controller 502 and a second integrated circuit die can include the gate driver 504. In yet other examples, the gate driver system 500 can include two or more integrated circuit packages. For example, the gate driver system 500 can include a first integrated circuit package and a second integrated circuit package. The first integrated circuit package can include a first integrated circuit die that includes the controller 502. The second integrated circuit package can include a second integrated circuit die that includes the gate driver 504.

In some examples, the gate driver system 500 corresponds to one integrated device including the controller 502, the gate driver 504, the first transistor 508, and the desaturation circuit 510. In other examples, the gate driver system 500 can correspond to a first integrated device including the controller 502, a second integrated device including the gate driver 504, a third integrated device including the first transistor 508, and a fourth integrated device including the desaturation circuit, where the first through fourth integrated devices are separately manufactured and can be integrated into a single module, package, etc. In such examples, the first through fourth integrated devices are separate integrated devices and may not be packaged and/or otherwise assembled together prior to being received by an end user. For example, the end user may separately obtain the first through fourth integrated devices and arrange the first through fourth integrated devices as depicted in FIG. 5 after separately obtaining the integrated devices. Alternatively, the gate driver system 500 may correspond to any other combination of the controller 502, the gate driver 504, the first transistor 508, and the desaturation circuit 510 into one or more integrated circuits, one or more integrated devices, etc.

In the illustrated example of FIG. 5, the gate driver 504 controls operation of the first transistor 508. For example, the gate driver 504 can turn on and/or otherwise enable the first transistor, turn off and/or otherwise disable the first transistor 508, etc. In some examples, the gate driver 504 controls operation of the desaturation circuit 510. For example, the gate driver 504 can inject a current (e.g., a bias current, a positive current, etc.) into the desaturation circuit 510 to measure a voltage associated with the first transistor 508.

In the illustrated example of FIG. 5, the gate driver 504 includes the control logic 506, an example comparator 509, a second example transistor 512, an example multiplexer 514, an example analog-to-digital (ADC) converter 516, and example driver control logic 518. In FIG. 5, the comparator 509 has a first input, a second input, and an output. The first input of the comparator 509 is coupled to an example voltage input pin (VCC2) 520 associated with an example current source 522. The second input of the comparator 509 is coupled to a reference voltage input. In FIG. 5, the reference voltage input is 0 V, however, in other examples, the reference voltage input may have a different voltage. The output of the comparator 509 is coupled to a first input of the control logic 506.

In the illustrated example of FIG. 5, the second transistor 512 is a N-channel FET (e.g., an N-channel MOSFET) having a gate (e.g., a control terminal, a gate terminal, etc.) 524 and current terminals 526, 528 including a drain (e.g., a drain terminal, a drain current terminal, etc.) 526 and a source (e.g., a source terminal, a source current terminal, etc.) 528. Alternatively, the gate driver 504 may be implemented with the second transistor 512 being a P-channel MOSFET. Alternatively, the gate driver 504 may be implemented with a different type and/or quantity of FETs than depicted in FIG. 5.

In the illustrated example of FIG. 5, the gate 524 of the second transistor 512 is coupled to an output of the control logic 506. In FIG. 5, the drain 526 is coupled to a cathode of an example diode 529. In FIG. 5, the source 528 is coupled to a reference rail (e.g., a reference voltage rail, a ground rail, etc.). In FIG. 5, an anode of the diode 529 is coupled to the voltage input pin 520, the first input of the comparator 509, a first input of the multiplexer 514, and the desaturation circuit 510.

In the illustrated example of FIG. 5, the multiplexer 514 has the first input, a second input, and an output. The first input of the multiplexer 514 is coupled to the voltage input pin 520, the first input of the comparator 509, and the desaturation circuit 510. The second input of the multiplexer 514 is coupled to a second output of the control logic 506. The output of the multiplexer 514 is coupled to an input of the ADC 516. An output of the ADC 516 is coupled to an input of the controller 502 via the second pin 505. For example, the ADC 516 and/or, more generally, the gate driver 504, can be manufactured separately from the controller 502 and, thus, the ADC 516 can be configured to be coupled to the controller 502 via the second pin 505.

In the illustrated example of FIG. 5, a second input of the control logic 506 is coupled to an output of the controller 502 via the first pin 503. For example, the control logic 506 and/or, more generally, the gate driver 504, can be manufactured separately from the controller 502 and, thus, the control logic 506 can be configured to be coupled to the controller 502 via the first pin 503.

In the illustrated example of FIG. 5, the first transistor 508 is an N-channel SiC FET (e.g., an N-channel SiC MOSFET) having a gate 530, current terminals 532, 534 including a drain 532 and a source 534, and a body diode 536. Alternatively, the first transistor 508 may be any other type of FET (e.g., an N-channel Gallium Nitride (GaN) MOSFET, a P-channel SiC MOSFET, etc.). In FIG. 5, the driver control logic 518 is coupled to the first transistor 508 via one or more example pins 538, 540, 542 including a fourth example pin (OUTH) 538, a fifth example pin (OUTL) 540, and a sixth example pin (COM) 542. The voltage input pin 520, the fourth pin 538, the fifth pin 540, the sixth pin 542, and an example desaturation (DESAT) pin 544 are electrical connections (e.g., integrated circuit (IC) pins, vias, nodes, etc.) of the gate driver 504 to electrically couple with different circuits, devices, etc. In FIG. 5, the fourth through sixth pins 538, 540, 542 can correspond to transistor pins, power transistor pins, etc., that can be configured to be coupled to the first transistor 508. In FIG. 5, the DESAT pin 544 can correspond to a sensing pin, a voltage sensing pin, a desaturation voltage sensing pin, etc., that can be configured to be coupled to a sensing circuit, such as the desaturation circuit 510.

In the illustrated example of FIG. 5, the driver control logic 518 is a driver control circuit, a driver control logic circuit, etc., corresponding to one or more drivers. For example, the driver control logic 518 can include, correspond to, and/or otherwise implement an output high (OUTH) driver and an output low (OUTL) driver. In such examples, the OUTH driver and/or the OUTL driver can generate a voltage (e.g., an output voltage) by adjusting a current path from the driver control logic 518 to the first transistor 508.

In the illustrated example of FIG. 5, the driver control logic 518 is coupled to the controller 502 via the third pin 507. For example, the driver control logic 518 and/or, more generally, the gate driver 504, can be manufactured separately from the controller 502 and, thus, the driver control logic 518 can be configured to be coupled to the controller 502 via the third pin 507.

In the illustrated example of FIG. 5, the controller 502 includes an example circuit interface 560, an example data comparator 565, an example database 570, and an example alert generator 590. In FIG. 5, the database 570 includes example baseline data 575 and example historical data 580.

In the illustrated example of FIG. 5, the controller 502 includes the circuit interface 560 to query the gate driver 504 for measurement(s). For example, the circuit interface 560 can correspond to a serial peripheral interface (SPI) bus, an inter-integrated circuit (I2C) bus, a universal asynchronous receiver-transmitter (UART) bus, etc. In some examples, circuit interface 560 queries the driver control logic 518 for one or more measurements associated with the first transistor 508. For example, the circuit interface 560 can transmit a request to the driver control logic 518 and the control logic 506 to obtain a first measurement that corresponds to the IDS flowing through the first transistor 508 and/or a second measurement that corresponds to the VGS of the first transistor 508. In such examples, the driver control logic 518 can obtain and/or otherwise measure the first measurement and/or the second measurement via the pins 538, 540, 542, 544 or one or more different pins of the gate driver 504 to measure electrical characteristics or parameters, such as IDS and/or VGS, of the first transistor 508. In some examples, the driver control logic 518 transmits the measurements to the circuit interface 560, which can store the measurements as the historical data 580.

In the illustrated example of FIG. 5, the controller 502 includes the data comparator 565 to determine whether the IDS associated with the first transistor 508 is high or low as described in connection with the example table 700 of FIG. 7 based on the first measurement (e.g., based on the first measurement obtained from the driver control logic 518, and/or, more generally, the gate driver 504). In other examples, the data comparator 565 can determine whether the VGS associated with the first transistor 508 is high or low as described in connection with the example table 700 of FIG. 7 based on the second measurement (e.g., based on the second measurement obtained from the driver control logic 518, and/or, more generally, the gate driver 504).

In the illustrated example of FIG. 5, the controller 502 includes the database 570 to record data, such as the baseline data 575, the historical data 580, etc. In some examples, the baseline data 575 corresponds to one or more pre-defined thresholds (e.g., degradation threshold(s)). For example, the baseline data 575 can include a first baseline value for the IDS associated with the first transistor 508, a second baseline value for the VGS associated with the first transistor 508, etc. In such examples, the data comparator 565 can compare a current or instant value of the IDS, the VGS, etc., to a respective one of the first baseline value or the second baseline value. In some examples, the data comparator 565 invokes the alert generator 590 to generate an alert, a notification, set a flag in a bit register, etc., in response to determining that the baseline value(s) have been met and/or otherwise satisfied. In such examples, the alert generator 590 can transmit an alert to a different controller, an electronic control unit (ECU), one or more processors, etc., via a circuit bus, a network interface, etc. In some examples, the alert generator 590 can transmit the alert to a user interface (e.g., a display in a vehicle), one or more speakers (e.g., a speaker of a vehicle audio system), etc., and/or a combination thereof. In some examples, the alert includes a message (e.g., a string of ASCII characters, one or more words, etc.) indicating that the first transistor 508 and/or other components of the gate driver system 500 needs maintenance, requires replacement, or other action.

In some examples, the historical data 580 corresponds to one or more measurements associated with the first transistor 508 and/or, more generally, the gate driver system 500 of FIG. 5. In such examples, the historical data 580 can correspond to previously obtained measurements (e.g., historical measurements) and/or measurements that are current or measured in substantially real time. For example, the circuit interface 560 can obtain a first value for the IDS associated with the first transistor 508 at a first time and a second value for the VGS associated with the first transistor 508 at the first time. In such examples, the database 570 can store the first value and the second value as portion(s) of the historical data 580. For example, the historical data 580 can store and/or otherwise include the first value, the second value, a third value for the IDS associated with the first transistor 508 at a second time after the first time, a fourth value for the VGS associated with the first transistor 508 at the second time, etc.

In the illustrated example of FIG. 5, the controller 502 includes the alert generator 590 to generate an alert in response to determining that one or more measurements associated with the first transistor 508, and/or, more generally, the gate driver system 500 of FIG. 5, satisfy a degradation threshold. In some examples, the baseline data 575 includes a first value (e.g., a first pre-defined value, a first baseline value, etc.) for the VGS of the first transistor 508, where the first value corresponds to a degradation threshold. In such examples, the circuit interface 560 can obtain a second value for the VGS of the first transistor 508 and the historical data 580 can store the second value as a portion of the historical data 580. The data comparator 565 can compare the second value to the degradation threshold. In some examples, the data comparator 565 determines that the second value meets and/or otherwise satisfies the degradation threshold when the second value is greater than the degradation threshold. In some examples, the data comparator 565 determines that the second value meets and/or otherwise satisfies the degradation threshold when the second value is less than the degradation threshold. In such examples, in response to determining that the second value satisfies the degradation threshold, the data comparator 565 can determine that the FET may experience potential failure.

The data comparator 565 can invoke and/or otherwise instruct the alert generator 590 to generate an alert based on the determination by the data comparator 565.

In some examples, the alert generator 590 generates an alert, a notification, etc., sets a flag in a bit register, etc., and/or a combination thereof in response to detecting a potential failure of the first transistor 508. In some examples, the alert generator 590 generates an alert to facilitate a shutdown of the first transistor 508, the gate driver 504, and/or the gate driver system 500. In some examples, the alert generator 590 generates and/or transmits an indication to a different controller, a different integrated circuit, a different system, etc., that repair and/or replacement of the first transistor 508 may be needed to improve system health and/or reliability.

In some examples, the data comparator 565 can compare a first value of the IDS, the VGS, etc., to a respective one of the first baseline value or the second baseline value. In some examples, the data comparator 565 invokes the alert generator 590 to generate an alert, a notification, set a flag in a bit register, etc., in response to determining that the baseline value(s) have been met and/or otherwise satisfied. In such examples, the data comparator 565 can transmit an alert to a different controller, one or more processors, etc., via a circuit bus, a network interface, etc.

In the illustrated example of FIG. 5, the database 570 can be implemented by non-volatile memory (e.g., read-only memory (ROM), electrically erasable programmable read-only memory (EEPROM), flash memory, etc.), volatile memory (e.g., SDRAM, DRAM, etc., and/or any other type of RAM device), etc. While in the illustrated example the database 570 is illustrated as a single database, the database 570 can be implemented by any number and/or type(s) of databases. Furthermore, the data stored in the database 260 can be in any data format such as, for example, binary data, comma delimited data, tab delimited data, hexadecimal data, etc.

In some examples, one or more of the circuit interface 560, the data comparator 565, the database 570, and/or the alert generator 590 can be implemented by one or more analog or digital circuit(s), logic circuits, programmable processor(s), programmable controller(s), GPU(s), DSP(s), ASIC(s), PLD(s), and/or FPLD(s). In other examples, one or more of the circuit interface 560, the data comparator 565, the database 570, and/or the alert generator 590 can be one or more hardware implemented finite state machines. For example, one or more of the circuit interface 560, the data comparator 565, the database 570, and/or the alert generator 590 can correspond to one or more microcontrollers (e.g., one or more analog microcontrollers) that include analog peripherals for sensing and/or measurement functions. In such examples, one or more of the circuit interface 560, the data comparator 565, the database 570, and/or the alert generator 590 can include one or more PGAs, one or more comparators, one or more transimpedance amplifiers, one or more operational amplifiers, etc., and/or a combination thereof.

In the illustrated example of FIG. 5, the gate 530 is coupled to the fourth pin 538. In FIG. 5, the fourth pin 538 is coupled to the gate 530 of the first transistor 508. For example, the fourth pin 538 can be coupled to the gate 530 via zero, one, or more circuit elements such as resistors, capacitors, buffers, etc. The fourth pin 538 corresponds to a first path (e.g., a current path) or a first output (e.g., a high output, a high voltage output, an output voltage, etc.) of the driver control logic 518 (e.g., an OUTH driver included in the driver control logic 518). For example, the driver control logic 518 can adjust the voltage at the fourth pin 538 to turn on the first transistor 508 by pulling up a gate voltage of the gate 530 above a threshold voltage (VTH). In such examples, the driver control logic 518 can pull up the gate voltage of the gate 530 by adjusting a current path to the gate 530. For example, the driver control logic 518 can turn on one or more transistors included in and/or otherwise associated with the driver control logic 518 to adjust the current path of the gate 530 to a voltage rail, a reference voltage rail, etc., to charge the gate 530.

In the illustrated example of FIG. 5, the driver control logic 518 is coupled to the fifth pin 540. In FIG. 5, the fifth pin 540 is coupled to the gate 530 of the first transistor 508. For example, the fifth pin 540 can be coupled to the gate 530 via zero, one, or more circuit elements such as resistors, capacitors, buffers, etc. The fifth pin 540 corresponds to a second path (e.g., a current path) or a second output (e.g., a low output, a low voltage output, an output voltage, etc.) of the driver control logic 518 (e.g., an OUTL driver included in the driver control logic 518). For example, the driver control logic 518 can adjust the voltage at the fifth pin 540 to turn off the first transistor 508 by pulling down a gate voltage of the gate 530 below the threshold voltage. In such examples, the driver control logic 518 can pull down the gate voltage of the gate 530 by adjusting a current path to the gate 530. For example, the driver control logic 518 can turn off one or more transistors included in and/or otherwise associated with the driver control logic 518 to adjust the current path of the gate 530 to a ground rail, a reference rail, etc., to discharge the gate 530.

In the illustrated example of FIG. 5, the sixth pin 542 is coupled to the source 534 of the first transistor 508. For example, the sixth pin 542 can be coupled to the source 534 via zero, one, or more circuit elements such as resistors, capacitors, buffers, etc.

In the illustrated example of FIG. 5, the desaturation circuit 510 includes a second example diode 546, a third example diode 548, an example capacitor 550, and an example resistor 552. In FIG. 5, the capacitor 550 has (1) a first side or a first terminal (e.g., a first capacitor terminal) and (2) a second side or a second terminal (e.g., a second capacitor terminal). The capacitor 550 of FIG. 5 can be used to store an increasing voltage to invoke the second diode 546 to begin conducting current when the voltage exceeds a turn-on voltage of the second diode 546. For example, a time duration necessary to ramp up a stored voltage on the capacitor 550 to turn-on the second diode 546 can correspond to a blanking time associated with the first transistor 508. In FIG. 5, the resistor 552 has (1) a first end or a first terminal (e.g., a first resistor terminal) and (2) a second end or a second terminal (e.g., a second resistor terminal). In FIG. 5, a cathode of the third diode 548 is coupled to the DESAT pin 544, a first side of the capacitor 550, and a first end of the resistor 552. The third diode 548 of FIG. 5 can be used to clamp a voltage at the DESAT pin 544 to protect the gate driver 504 from damage (e.g., damage from an overcurrent and/or overvoltage condition). In FIG. 5, an anode of the third diode 548 and a second side of the capacitor 550 are coupled to a ground (GND) rail. In FIG. 5, the second end of the resistor 552 is coupled to an anode of the second diode 546. In FIG. 5, the cathode of the second diode 546 is coupled to the drain 532 of the first transistor 508.

In the illustrated example of FIG. 5, the controller 502 is a controller (e.g., a microcontroller) that executes machine readable instructions. In some examples, the controller 502 can be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)), and/or field programmable logic device(s) (FPLD(s)). In other examples, the controller 502 can be one or more hardware implemented finite state machines. For example, the controller 502 can correspond to one or more microcontrollers (e.g., one or more analog microcontrollers) that include analog peripherals for sensing and/or measurement functions. In such examples, the controller 502 can include one or more programmable gain amplifiers (PGAs), one or more comparators, one or more transimpedance amplifiers, one or more operational amplifiers, etc., and/or a combination thereof. In some examples, the controller 502 is an ECU (e.g., a vehicle ECU). In some examples, the controller 502 is included in the ECU.

In the illustrated example of FIG. 5, the control logic 506 is a hardware implemented finite state machine. For example, the control logic 506 can correspond to one or more microcontrollers (e.g., one or more analog microcontrollers) that include analog peripherals for sensing and/or measurement functions. In such examples, the control logic 506 can include one or more PGAs, one or more comparators, one or more transimpedance amplifiers, one or more operational amplifiers, etc., and/or a combination thereof. In some examples, the control logic 506 corresponds to one or more controllers (e.g., microcontrollers) that execute machine readable instructions. In some examples, the control logic 506 can be implemented by one or more analog or digital circuit(s), logic circuits, programmable processor(s), programmable controller(s), GPU(s), DSP(s), ASIC(s), PLD(s), and/or FPLD(s).

In the illustrated example of FIG. 5, the comparator 509 is a Schmitt trigger. For example, the comparator 509 can be used for de-saturation protection. Alternatively, the comparator 509 may be any other type of comparator (e.g., a voltage comparator). For example, the comparator 509 can compare a first voltage at the first input to a second voltage at the second input of the comparator 509. In such examples, the second voltage at the second input of the comparator 509 can be 0V or any other reference voltage. In such examples, the comparator 509 can assert a logic High signal (e.g., a voltage and/or current corresponding to and/or otherwise indicative of a logic '1') in response to the first voltage being greater than the second voltage. In other examples, the comparator 509 can generate a logic Low signal (e.g., a voltage and/or current corresponding to and/or otherwise indicative of a logic '0') in response to the first voltage being less than the second voltage.

In example operation, the controller 502 transmits a first request to the control logic 506 to measure and/or otherwise obtain a first voltage measurement corresponding to a first DESAT voltage (e.g., VDESAT1). The controller 502 can determine a baseline or reference voltage associated with the desaturation circuit 510 based on the first DESAT voltage. The first DESAT voltage can correspond to a first example case 710 described below in connection with FIG. 7. The controller 502 can invoke the control logic 506 to invoke the first case 710 in response to determining at least one of (1) the first transistor 508 being on because a VGS of the first transistor 508 is above VTH (e.g., VGS is high) of the first transistor 508 or (2) an IDS of the first transistor 508 is approximately zero (e.g., IDS is low).

In the first case 710, the first DESAT voltage is based on a sum of a first voltage corresponding to a first VDS (e.g., VDS1) of the first transistor 508, a second voltage corresponding to a voltage across the resistor 552 (e.g., VR1), and a third voltage corresponding to a voltage across the second diode 546 (e.g., VD1). In such examples, controller 502 can determine the first DESAT voltage as described below in connection with Equation (1):

$$VDESAT1 = VR1 + VD1 + VDS1 \qquad \text{Equation (1)}$$

In the example of Equation (1) above, the controller 502 can determine VDS1 as described below in connection with Equation (2):

$$VDS1 = RDSON * IDS \qquad \text{Equation (2)}$$

Accordingly, because IDS is approximately zero, VDS1 is also approximately zero. Thus, the controller 502 can determine that VDESAT1 corresponds to approximately the sum of VR1 and VD1 as described above in connection with Equation (1) when VDS1 is approximately zero as in the first case 710.

In example operation, the controller 502 transmits the first request by transmitting a control signal 554 to the control logic 506. For example, the controller 502 can transmit the first request by generating a first instance of the control signal 554 to the control logic 506. In response to obtaining the first request from the controller 502, the control logic 506 turns off the second transistor 512. In response to turning off the second transistor 512, current from the current source 522 (e.g., based on voltage at the voltage input pin 520) flows to the desaturation circuit 510 as illustrated by a first example current flow path 556 depicted in FIG. 5. For example, when the second transistor 512 is on, current from the current source 522 flows through the second transistor 512 to a ground or reference rail.

The current from the current source 522 flowing into the desaturation circuit 510 corresponds to an injection current (e.g., a positive injection current) having a magnitude to bias (e.g., forward bias) the second diode 546. In response to biasing the second diode 546, the second diode 546 conducts the current from the current source 522 to generate the first voltage (VDESAT1) at the DESAT pin 544. In the example of the first case 710, the first voltage at the DESAT pin 544 corresponds to the voltage across the resistor 552 and the second diode 546.

In response to generating VDESAT1 at the DESAT pin 544, the control logic 506 can direct, instruct, and/or otherwise invoke the multiplexer 514 to transmit VDESAT1 to the ADC 516. In FIG. 5, the multiplexer 514 is a multiplexer circuit corresponding to hardware logic (e.g., one or more analog or digital circuit(s), logic circuits, etc.) that can be used to select an electrical signal or corresponding data at the first input of the multiplexer 514 to be transmitted to the ADC 516.

In response to obtaining VDESAT1 from the multiplexer 514, the ADC 516 can convert VDESAT1, which is an analog voltage signal, to a digital output, a digital value (e.g., a binary value, a hexadecimal value, a machine readable value, etc.), etc., that can be transmitted to the controller 502. For example, the ADC 516 can transmit a digital value of VDESAT1 to the controller 502 via a communication bus (e.g., an Inter-Integrated Circuit (I2C) bus, a Serial Peripheral Interface (SPI) bus, etc.). In FIG. 5, the ADC 516 is a converter circuit corresponding to hardware logic (e.g., one or more analog or digital circuit(s), logic circuits, etc.) that can be used to convert an analog signal to a digital signal. In response to obtaining the digital value of VDESAT1, the controller 502 can store the digital value of DESAT1 in memory (e.g., a non-volatile memory, a volatile memory, etc.) or any other storage device.

In example operation, the controller 502 transmits a second request to the control logic 506 to measure and/or otherwise obtain a second voltage measurement corresponding to a second DESAT voltage (e.g., VDESAT2). The second DESAT voltage can correspond to a second example case 720 described below in connection with FIG. 7. The controller 502 can invoke the control logic 506 to invoke the second case 720 in response to determining at least one of (1) the first transistor 508 being off because a VGS of the first transistor 508 is below VTH (e.g., VGS is low) of the first transistor 508 or (2) an IDS of the first transistor 508 is negative (e.g., IDS is high, IDS corresponds to a high negative current value, etc.). For example, the IDS of the first transistor 508 being negative is illustrated by a second example current flow path 558 depicted in FIG. 5.

In the second case 720, the second DESAT voltage is based on a sum of a first voltage corresponding to a second VDS (e.g., VDS2) of the first transistor 508, a second voltage corresponding to a voltage across the resistor 552 (e.g., VR1), and a third voltage corresponding to a voltage across the second diode 546 (e.g., VD1). In such examples, controller 502 can determine the second DESAT voltage as described below in connection with Equation (3):

$$VDESAT2 = VR1 + VD1 + VDS2 \qquad \text{Equation (3)}$$

Accordingly, because VR1 and VD1 have substantially the same values as in the first case 710, the controller 502 can determine VDS2 as described below in connection with Equation (4):

$$VDS2 = VDESAT2 - VDESAT1 \qquad \text{Equation (4)}$$

Thus, the controller 502 can determine that VDS2 corresponds to approximately a difference between VDESAT1 obtained during the first case 710 and VDESAT2 obtained during the second case 720.

In example operation, the controller 502 transmits the second request by transmitting a second instance of the control signal 554 to the control logic 506. In response to obtaining the second request from the controller 502, the control logic 506 turns off the second transistor 512. In response to turning off the second transistor 512, current from the current source 522 (e.g., based on voltage at the voltage input pin 520) flows to the desaturation circuit 510 to bias the second diode 546 instead of flowing through the second transistor 512.

In response to biasing the second diode 546, the second diode 546 conducts the current from the current source 522 to generate the second voltage (VDESAT2) at the DESAT pin 544. In the example of the second case 720, the second voltage at the DESAT pin 544 corresponds to a sum of the voltage across the resistor 552 and the second diode 546 and VDS of the first transistor 508.

In response to generating VDESAT2 at the DESAT pin 544, the control logic 506 can direct, instruct, and/or otherwise invoke the multiplexer 514 to transmit VDESAT2 to the ADC 516. In response to obtaining VDESAT2 from the multiplexer 514, the ADC 516 can convert VDESAT2 to a digital value that can be transmitted to the controller 502. In response to transmitting the digital value of VDESAT2 to the controller 502, the controller 502 can store the digital value of DESAT2 in memory or any other storage device.

Advantageously, the gate driver 504 can inject the current from the current source 522 in response to satisfying the conditions of the example of the first case 710 to determine VDESAT1, which can incorporate manufacturing and temperature variations in the desaturation circuit 510. For example, VDESAT1 can be used by the controller 502 as a baseline or reference voltage to determine VDESAT2 and/or VDESAT3 as described above in connection with the examples of Equation (3) and/or Equation (4), and/or, more generally the second case 720 and/or the third case 730 of FIG. 7.

In example operation, the controller 502 transmits a third request to the control logic 506 to measure and/or otherwise obtain a third voltage measurement corresponding to a third DESAT voltage (e.g., VDESAT3). The third DESAT voltage can correspond to the third case 730 described below in connection with FIG. 7. The controller 502 can invoke the control logic 506 to invoke the third case 730 in response to determining at least one of (1) the first transistor 508 being on because a VGS of the first transistor 508 is above VTH (e.g., VGS is high) of the first transistor 508 or (2) an IDS of the first transistor 508 is negative.

In the third case 730, the third DESAT voltage is based on a sum of a first voltage corresponding to a third VDS (e.g., VDS3) of the first transistor 508, a second voltage corresponding to a voltage across the resistor 552 (e.g., VR1), and a third voltage corresponding to a voltage across the second diode 546 (e.g., VD1). In such examples, controller 502 can determine the third DESAT voltage as described below in connection with Equation (3):

$$VDESAT3 = VR1 + VD1 + VDS3 \quad \text{Equation (5)}$$

Accordingly, because VR1 and VD1 have substantially the same values as in the first case 710 and/or the second case 720, the controller 502 can determine VDS3 as described below in connection with Equation (6):

$$VDS3 = VDESAT3 - VDESAT1 \quad \text{Equation (6)}$$

Thus, the controller 502 can determine that VDS3 corresponds to approximately a difference between VDESAT1 obtained during the first case 710 and VDESAT3 obtained during the third case 730.

In example operation, the controller 502 transmits the third request by transmitting a third instance of the control signal 554 to the control logic 506. In response to obtaining the third request from the controller 502, the control logic 506 turns off the second transistor 512. In response to turning off the second transistor 512, current from the current source 522 (e.g., based on voltage at the voltage input pin 520) flows to the desaturation circuit 510 to bias the second diode 546 instead of flowing through the second transistor 512.

In response to biasing the second diode 546, the second diode 546 conducts the current from the current source 522 to generate the third voltage (VDESAT3) at the DESAT pin 544. In the example of the third case 730, the third voltage at the DESAT pin 544 corresponds to a sum of the voltage across the resistor 552 and the second diode 546 and VDS of the first transistor 508.

In response to generating VDESAT3 at the DESAT pin 544, the control logic 506 can direct, instruct, and/or otherwise invoke the multiplexer 514 to transmit VDESAT3 to the ADC 516. In response to obtaining VDESAT3 from the multiplexer 514, the ADC 516 can convert VDESAT3 to a digital value that can be transmitted to the controller 502. In response to transmitting the digital value of VDESAT3 to the controller 502, the controller 502 can store the digital value of DESAT3 in memory or any other storage device.

Advantageously, the gate driver 504 can inject the current from the current source 522 in response to satisfying the conditions of the example of the first case 710 to determine VDESAT1, which can incorporate manufacturing and temperature variations in the desaturation circuit 510. For example, VDESAT1 can be used by the controller 502 as a baseline or reference voltage to determine VDESAT2 and/or VDESAT3 as described above in connection with the examples of Equations (3), (4), (5), and/or (6), and/or, more generally the second case 720 and/or the third case 730 of FIG. 7.

In example operation, the controller 502 generates an alert based on at least one of VDESAT1, VDESAT2, or VDESAT3. In some examples, the controller 502 compares a first measurement of VDESAT2 measured and/or obtained at a first time to a second measurement of VDESAT2 measured and/or obtained at a second time, where the first time is prior to the second time. For example, the controller 502 can compare a value of VDESAT2 from the gate driver 504 to a previously obtained and/or stored value of VDESAT2 and determine a difference between the values based on the comparison. In such examples, the controller 502 can compare the difference to a threshold (e.g., a degradation threshold) and generate an alert in response to the difference being greater than and/or otherwise satisfying or meeting the threshold. The controller 502 can transmit the alert to an application (e.g., a software-based application) in communication with the controller 502. For example, the alert can be displayed to a user, transmitted to a different controller, etc. In other examples, the controller 502 can maintain the first transistor 508 in an off state to prevent an undesirable operating condition to occur in response to a failure of the first transistor 508.

In some examples, the data comparator 565, and/or, more generally, the controller 502, determines a first health parameter associated with the first transistor 508 based on at least one of VDESAT2 or the difference between VDESAT2 values obtained at different times during a life or operation of the first transistor 508. For example, the data comparator 565 can determine the first health parameter to be indicative of package degradation. In such examples, the package degradation can correspond to a remaining operation lifetime such as a percentage of non-failure operation life remaining, an estimated quantity of hours remaining prior to a potential failure, an estimated quantity of switching cycles of the first transistor 508 remaining prior to a potential failure, etc., where the potential failure is associated with the package of the first transistor 508. For example, the data comparator 565 can determine that the package of the first transistor 508 has degraded to a level indicative of an impending potential failure in response to the difference between VDESAT2 values meeting the threshold. In such examples, the alert generator 590 and/or, more generally, the controller 502, can generate an alert indicative of and/or including data or information corresponding to a potential failure of the first transistor 508 based on package degradation.

In some examples, the data comparator 565 and/or, more generally, the controller 502, determines a second health parameter associated with the first transistor 508 based on at least one of VDESAT3 or the difference between VDESAT3 values obtained at different times during a life or operation of the first transistor 508. For example, the data comparator 565 can determine the second health parameter to be indicative of die degradation and package degradation. In such examples, the die and package degradation can correspond to a remaining operation lifetime such as a percentage of non-failure operation life remaining, an estimated quantity of hours remaining prior to a potential failure, an estimated quantity of switching cycles of the first transistor 508 remaining prior to a potential failure, etc., where the potential failure is associated with the die and/or the package of the first transistor 508. For example, the data comparator 565 can determine that the die and/or the package of the first transistor 508 has degraded to a level indicative of an impending potential failure in response to the difference between VDESAT3 values meeting the threshold. In such examples, the alert generator 590 can generate an alert indicative of and/or including data or information corresponding to a potential failure of the first transistor 508 based on die degradation and/or package degradation.

In some examples, the gate driver system 500 can be manufactured at the same time and, thus, be coupled together. In some examples, the gate driver 504 can be manufactured without one or more of the controller 502, the first transistor 508, and/or the desaturation circuit 510. For example, the gate driver 504 can be manufactured and/or otherwise be configured to be coupled to the controller 502, the first transistor 508, and/or the desaturation circuit 510. In such examples, the desaturation pin 544 and/or, more generally, the gate driver 504 is to be coupled to the third diode 548, the capacitor 550, and/or the resistor 552. In other such examples, one or more of the fourth pin 538, the fifth pin 540, the sixth pin 542, etc., and/or, more generally, the gate driver 504, is/are to be coupled to the first transistor 508.

While an example manner of implementing the gate driver 504 of FIG. 5 is illustrated in FIG. 5, one or more of the elements, processes and/or devices illustrated in FIG. 5 may be combined, divided, re-arranged, omitted, eliminated and/or implemented in any other way. Further, the example control logic 506, the example comparator 509, the example transistor 512, the example multiplexer 514, the example ADC 516, the example driver control logic 518, and/or, more generally, the example gate driver 504 of FIG. 5 may be implemented by hardware, software, firmware and/or any combination of hardware, software and/or firmware. Thus, for example, any of the example control logic 506, the example comparator 509, the example transistor 512, the example multiplexer 514, the example ADC 516, the example driver control logic 518, and/or, more generally, the example gate driver 504 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)). When reading any of the apparatus or system claims of this patent to cover a purely software and/or firmware implementation, at least one of the example control logic 506, the example comparator 509, the example transistor 512, the example multiplexer 514, the example ADC 516, and/or the example driver control logic 518 is/are hereby expressly defined to include a non-transitory computer readable storage device or storage disk such as non-volatile memory (e.g., read-only memory (ROM), electrically erasable programmable read-only memory (EEPROM), flash memory, etc.), volatile memory (e.g., SDRAM, DRAM, etc., and/or any other type of RAM device), etc., including the software and/or firmware. Further still, the example gate driver 504 of FIG. 5 may include one or more elements, processes and/or devices in addition to, or instead of, those illustrated in FIG. 5, and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 6A:
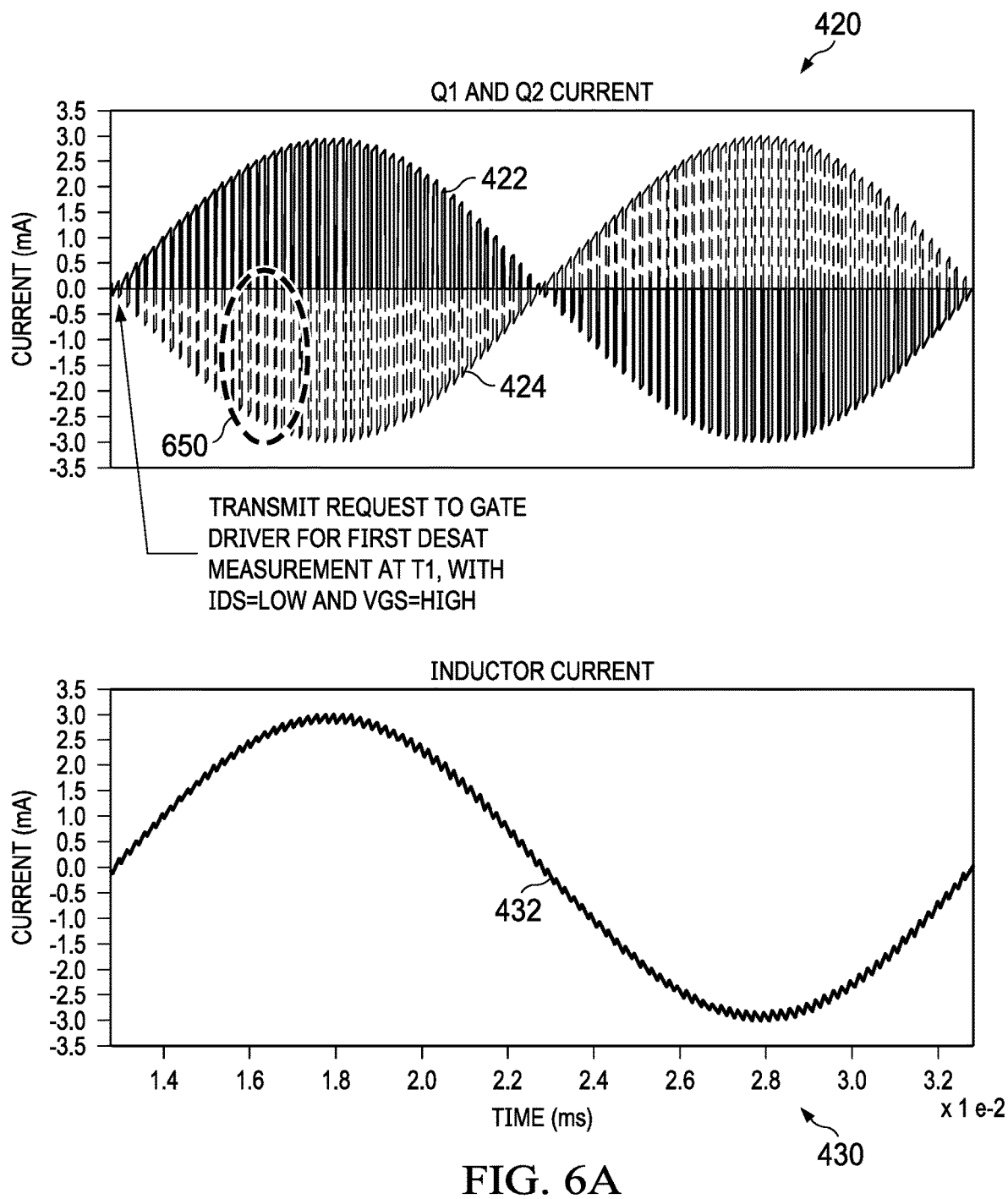
FIG. 6A depicts a first graph of a drain-to-source current of the transistor of FIG. 5 and a second graph of an inductor current of an inductor associated with the gate driver system of FIG. 5.

FIG. 6A depicts the first graph 420 of FIG. 4B. FIG. 6B depicts an example timing diagram 600 corresponding to the gate driver system 500 of FIG. 5. In the timing diagram 600, example waveforms 610, 620, 630, 640 are depicted including a first example waveform (Q1 DRIVER OUT) 610, a second example waveform (Q2 DRIVER OUT) 620, a third example waveform (Q2 IDS) 630, and a fourth example waveform (DESAT VOLTAGE) 640. The timing diagram 600 of FIG. 6B corresponds to an expanded or zoomed-in portion 650 of the first graph 420 of FIG. 4B.

Figures 6B, 7:
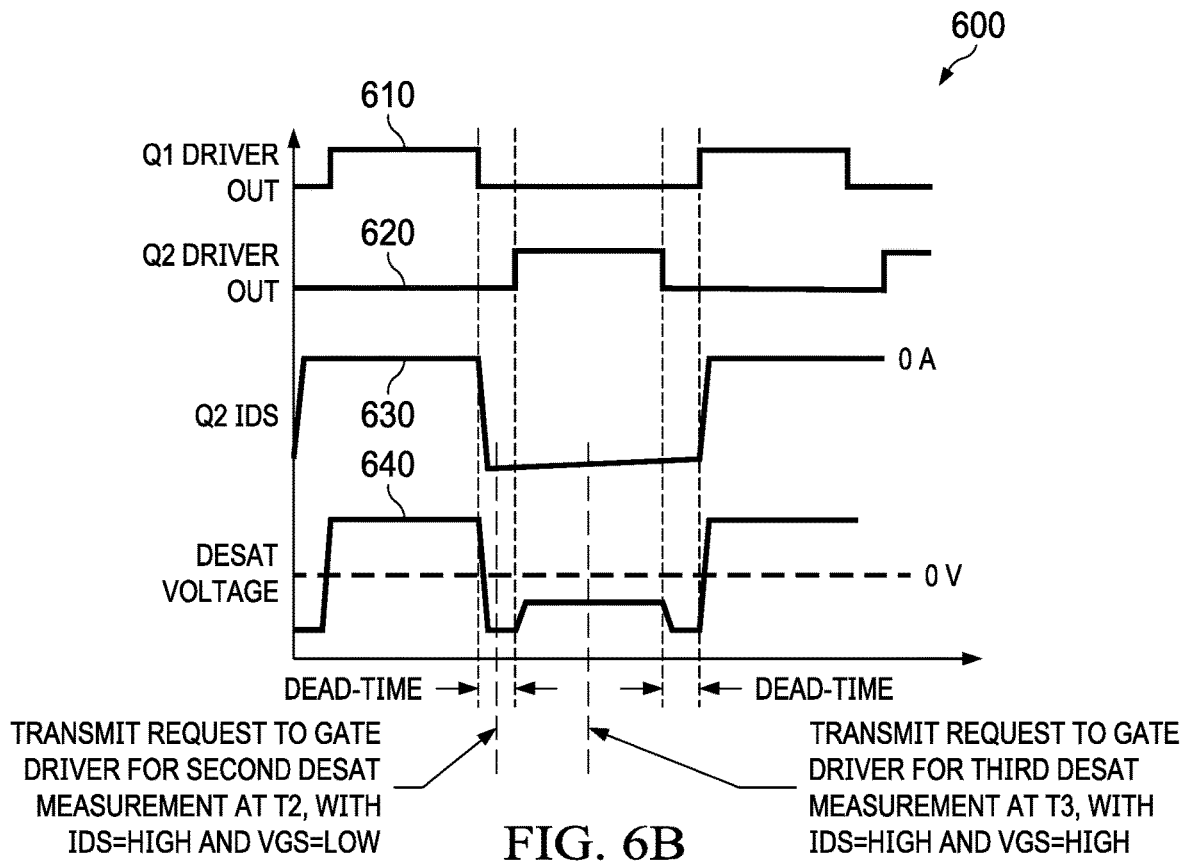
FIG. 6B depicts an example timing diagram corresponding to the gate driver system of FIG. 5.
FIG. 7 depicts an example table corresponding to different measurements associated with the transistor of FIG. 5.

In the timing diagram 600 of FIG. 6B, the first waveform 610 can correspond to a signal generated by a driver coupled to the first transistor 404 of FIG. 4A. For example, the first waveform 610 can be VGS of Q1 404 of FIG. 4A. The second waveform 620 can correspond to a signal generated by a driver coupled to the second transistor 406 of FIG. 4A. For example, the second waveform 620 can be VGS of Q2 406 of FIG. 4A and/or VGS of the first transistor 508 of FIG. 5. In such examples, the second waveform 620 can correspond to a signal generated by the driver control logic 518, and/or, more generally, the gate driver 504 of FIG. 5, to control operation of the first transistor 508. The third waveform 630 can correspond to an IDS of the first transistor 508 of FIG. 5, the second transistor 406 of FIG. 4A, etc. The fourth waveform 640 can correspond to a voltage generated by the desaturation circuit 510 that can be measured at and/or otherwise correspond to a voltage at the DESAT pin 544.

In the illustrated example of FIG. 6A, at a first example time (T1), the circuit interface 560 of FIG. 5, and/or, more generally, the controller 502 of FIG. 5, transmits a first request to the gate driver 504 of FIG. 5 to obtain a first DESAT measurement (e.g., a first DESAT voltage, a first voltage, etc.) via the desaturation circuit 510 of FIG. 5. The first request at the first time can correspond to the first case 710 of FIG. 7, where IDS is low and VGS is high. The controller 502 can determine a first VDS measurement based on the first DESAT measurement as described in connection with the examples of Equations (1)-(2) above, and/or, more generally as described in connection with the first case 710 of FIG. 7.

In the illustrated example of FIG. 6B, at a second example time (T2), the circuit interface 560, and/or, more generally, the controller 502, transmits a second request to the gate driver 504 to obtain a second DESAT measurement (e.g., a second DESAT voltage, a second voltage, etc.) via the desaturation circuit 510. The second request at the second time can correspond to the second case 720 of FIG. 7, where IDS is high and VGS is low. The controller 502 can determine a second VDS associated with the first transistor 508 based on the second DESAT measurement as described in connection with the examples of Equations (3)-(4) above, and/or, more generally as described in connection with the second case 720 of FIG. 7. The IDS of the first transistor 508 is negative at the second time, which causes the second DESAT measurement to be negative at the second time. Advantageously, by determining the second VDS in response to the second DESAT measurement being negative, the controller 502 can quantify and/or otherwise analyze a level of package degradation that prior desaturation circuits could not analyze.

In the illustrated example of FIG. 6B, at a third example time (T3), the circuit interface 560, and/or, more generally, the controller 502, transmits a third request to the gate driver 504 to obtain a third DESAT measurement (e.g., a third DESAT voltage, a third voltage, etc.) via the desaturation circuit 510. The third request at the third time can correspond to the third case 730 of FIG. 7, where IDS is high and VGS is high. The controller 502 can determine a third VDS associated with the first transistor 508 based on the third DESAT measurement as described in connection with the examples of Equations (5)-(6) above, and/or, more generally as described in connection with the third case 730 of FIG. 7. The IDS of the first transistor 508 is negative at the third time, which causes the third DESAT measurement to be negative at the third time.

In the illustrated example of FIG. 6B, the second time is in time durations corresponding to a dead time or a blanking time associated with the first transistor 508. In FIG. 6B, the third DESAT measurement is less negative than the second DESAT measurement in FIG. 6B because VGS is higher at the third time than at the second time, which causes the DESAT voltage to be higher at the third time than at the second time as the transistor channel conducts. Advantageously, by determining the third VDS in response to the third DESAT measurement being negative, the data comparator 565, and/or, more generally, the controller 502, can quantify and/or otherwise analyze a level of die degradation and package degradation that prior desaturation circuits could not analyze.

FIG. 7 depicts an example table 700 corresponding to different measurements associated with the first transistor 508 of FIG. 5. The table 700 includes the first case 710, the second case 720, and the third case 730. Alternatively, the examples described herein may include fewer or more cases, and/or, more generally, include fewer or more voltage measurements associated with the first transistor 508 to evaluate die degradation and/or package degradation.

The table 700 of FIG. 7 corresponds to operation of the second transistor 406 of FIG. 4A and/or the first transistor 508 of FIG. 5. For example, the first case 710 can correspond to an example where the first transistor 508 of FIG. 5 has a low IDS (e.g., a substantially or approximately zero IDS) and a high VGS (e.g., the first transistor 508 is turned on and/or otherwise enabled, VGS satisfies and/or otherwise meets VTH of the first transistor 508, etc.). In such examples, VDESAT1 at the DESAT pin 544 of FIG. 5 can correspond to a value based on a sum of a first voltage across the resistor 552 of FIG. 5, a second voltage across the second diode 546 of FIG. 5, and a third voltage corresponding to VDS1 of the first transistor 508. Because IDS is low, VDS of the first transistor 508 in the first case 710 can correspond to a sum of the first voltage and the second voltage as the third voltage is approximately zero.

In some examples, the second case 720 can correspond to an example where the first transistor 508 of FIG. 5 has a high IDS (e.g., a negative IDS, a substantially high negative current) and a low VGS (e.g., the first transistor 508 is turned off and/or otherwise disabled, VGS does not satisfy and/or otherwise meet VTH of the first transistor 508, etc.). In such examples, VDESAT2 can be measured and/or otherwise obtained at the DESAT pin 544 of FIG. 5, which can correspond to a value based on a sum of a first voltage across the resistor 552 of FIG. 5, a second voltage across the second diode 546 of FIG. 5, and a third voltage corresponding to VDS2 of the first transistor 508. Advantageously, because the first voltage and the second voltage are approximately the same as in the first case 710 (e.g., manufacturing and/or temperature variations have been incorporated into VDESAT1), the data comparator 565 of FIG. 5, and/or, more generally, the controller 502, can determine that VDS2 is a difference between VDESAT2 (e.g., second DESAT measurement measured at the second time of FIG. 6B) and VDESAT1 (e.g., first DESAT measurement measured at the first time of FIG. 6A prior to the second time of FIG. 6B), which has been previously obtained and/or stored by the controller 502.

In some examples, the third case 730 can correspond to an example where the first transistor 508 of FIG. 5 has a high IDS and a high VGS. In such examples, VDESAT3 can be measured and/or otherwise obtained at the DESAT pin 544 of FIG. 5, which can correspond to a value based on a sum of a first voltage across the resistor 552 of FIG. 5, a second voltage across the second diode 546 of FIG. 5, and a third voltage corresponding to VDS3 of the first transistor 508. Advantageously, because the first voltage and the second voltage are approximately the same as in the first case 710, the data comparator 565 and/or, more generally, the controller 502, can determine that VDS3 is a difference between VDESAT3 (e.g., third DESAT measurement measured at the third time of FIG. 6B) and VDESAT1 (e.g., first DESAT measurement measured at the first time of FIG. 6A prior to the third time of FIG. 6B), which has been previously obtained and/or stored by the controller 502.

Figure 8:
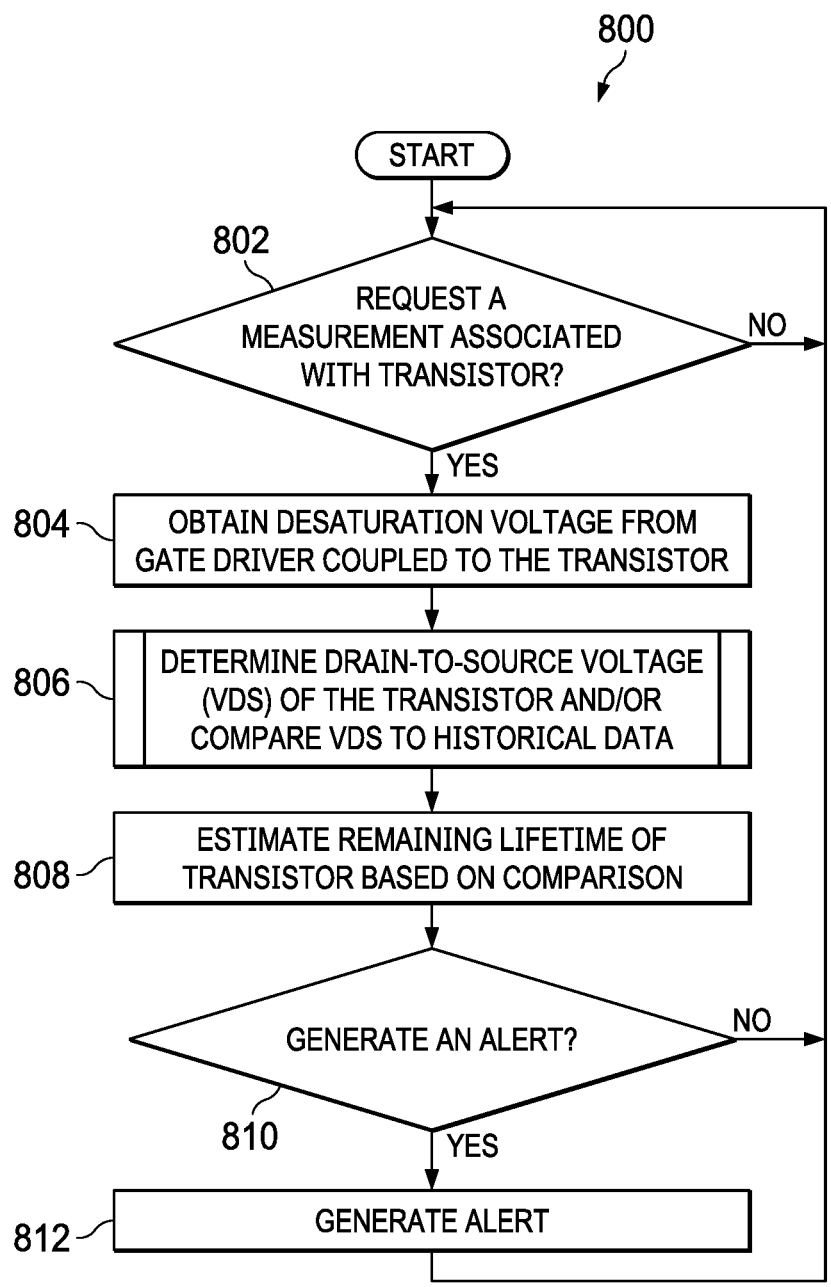
FIG. 8 is a flowchart representative of a process that may be carried out while utilizing example machine readable instructions that may be executed and/or hardware configured to implement the controller of FIG. 5 to facilitate health monitoring of the transistor of FIG. 5.
Figure 9:
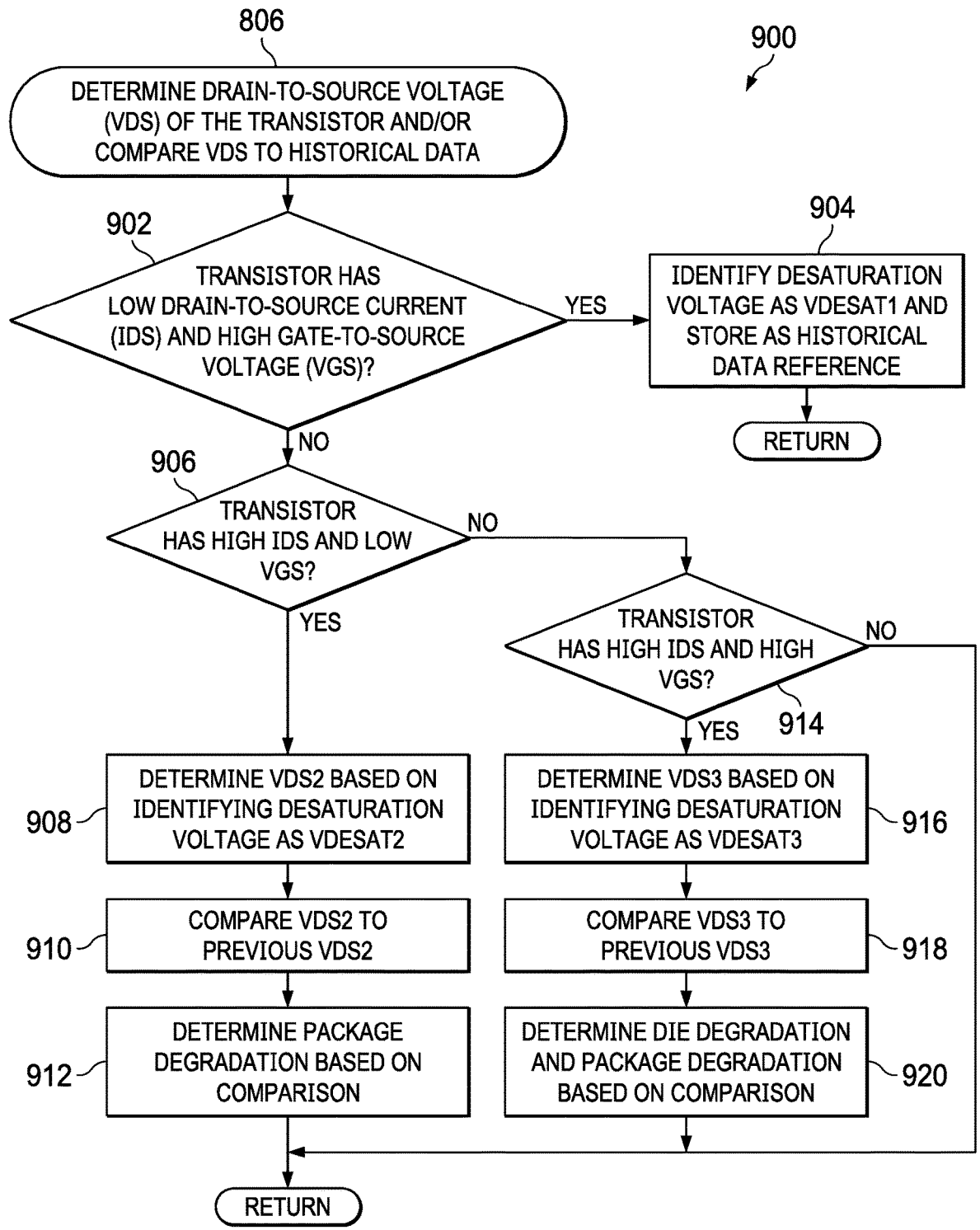
FIG. 9 is a flowchart representative of a process that may be carried out while utilizing example machine readable instructions that may be executed and/or hardware configured to implement the controller of FIG. 5 to determine a drain-to-source voltage of the transistor of FIG. 5 and/or compare the drain-to-source voltage to historical data.

Flowcharts representative of example hardware logic, machine readable instructions, hardware implemented state machines, and/or any combination thereof for implementing the controller 502 of FIG. 5 is shown in FIGS. 8-9. The machine readable instructions may be one or more executable programs or portion(s) of an executable program for execution by the controller 502. The program may be embodied in software stored on a non-transitory computer readable storage medium such as non-volatile memory, volatile memory, etc., associated with the controller 502, but the entire program and/or parts thereof could alternatively be executed by a device other than the controller 502 and/or embodied in firmware or dedicated hardware. Further, although the example program is described with reference to the flowchart illustrated in FIGS. 8-9, many other methods of implementing the example controller 502 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the described machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C#, Perl, Python, JavaScript, HyperText Markup Language (HTML), Structured Query Language (SQL), Swift, etc.

As mentioned above, the example processes of FIGS. 8-9 may be implemented using executable instructions (e.g., computer and/or machine readable instructions) stored on a tangible non-transitory computer and/or machine readable medium such as non-volatile memory (e.g., read-only memory (ROM), electrically erasable programmable read-only memory (EEPROM), flash memory, etc.), volatile memory (e.g., Synchronous Dynamic Random Access Memory (SDRAM), Dynamic Random Access Memory (DRAM), etc., and/or any other type of random access memory (RAM) device), etc., and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 8 is a flowchart representative of an example process 800 that may be carried out while utilizing machine readable instructions that may be executed and/or hardware configured to implement the controller 502 of FIG. 5 to effectuate health monitoring of the first transistor 508 of FIG. 5. The process 800 of FIG. 8 begins at block 802, at which the controller 502 determines whether to request a measurement associated with a transistor. For example, the data comparator 565 (FIG. 5) can determine that the IDS flowing through the first transistor 508 of FIG. 5 is high or low based on a measurement of the IDS. In other examples, the data comparator 565 can determine that the VGS of the first transistor 508 of FIG. 5 is high or low based on a measurement of the VGS. In such examples, the data comparator 565 can determine whether one or more conditions of the first case 710, the second case 720, or the third case 730 of FIG. 7 are satisfied. For example, the circuit interface 560 (FIG. 5) and/or, more generally, the controller 502, can determine to request the gate driver 504 of FIG. 5 to obtain a measurement associated with the first transistor 508, such as a DESAT voltage, via the desaturation circuit 510 of FIG. 5. In such examples, the circuit interface 560 can determine to request for the measurement in response to determining that the one or more conditions of the first case 710, the second case 720, or the third case 730 of FIG. 7 are satisfied.

If, at block 802, the controller 502 determines not to request a measurement associated with the transistor, control waits at block 802 (e.g., waits until a determination is made to request the measurement). If, at block 802, the controller 502 determines to request a measurement associated with the transistor, then, at block 804, the controller 502 obtains data and/or a digital reading of a desaturation voltage from a gate driver coupled to the transistor. For example, the circuit interface 560 can obtain VDESAT1 from the gate driver 504 of FIG. 5, where VDESAT1 is based on a voltage generated by the desaturation circuit 510 and measured at and/or otherwise obtained from the DESAT pin 544 of FIG. 5.

At block 806, the controller 502 determines a drain-to-source voltage (VDS) of the transistor and/or compares the VDS to historical data. For example, the data comparator 565 can determine the VDS1 of the first transistor 508 based on the VDESAT1. In other examples, the data comparator 565 can determine a first VDS2 of the first transistor 508 based on the VDESAT2, compare the first VDS2 to a second VDS2 previously determined by the data comparator 565, and estimate a remaining lifetime of the transistor based on the comparison. An example process that may be used to implement block 806 is described in connection with FIG. 9.

At block 808, the controller 502 estimates a remaining lifetime of the transistor based on the comparison. For example, the data comparator 565 can determine a first health parameter indicative of package degradation of the first transistor 508 based on at least one of VDESAT2 or the difference between VDESAT2 values obtained at different times during a life or operation of the first transistor 508. In such examples, the data comparator 565 can determine an estimate remaining lifetime of the first transistor 508 based on the first health parameter, and/or, more generally, an estimated level of package degradation associated with the first transistor 508. In other examples, the data comparator 565 can determine a second health parameter indicative of die degradation and package degradation of the first transistor 508 based on at least one of VDESAT3 or the difference between VDESAT3 values obtained at different times during a life or operation of the first transistor 508. In such examples, the data comparator 565 can determine an estimate remaining lifetime of the first transistor 508 based on the second health parameter, and/or, more generally, an estimated level of die degradation and package degradation associated with the first transistor 508.

At block 810, the controller 502 determines whether to generate an alert. For example, the alert generator 590 (FIG. 5) can generate an alert based on at least one of the first health parameter or the second parameter. In such examples, the alert generator 590 can determine to generate an alert in response to determining that a difference between VDESAT2 values obtained at different times during a life or operation of the first transistor 508 meets a degradation threshold. In other examples, the alert generator 590 can determine to generate an alert in response to determining that a difference between VDESAT3 values obtained at different times during a life or operation of the first transistor 508 meets a degradation threshold.

At block 812, the controller 502 generates an alert. For example, the alert generator 590 can generate an alert (e.g., an alert including a message) to prompt a user (e.g., a driver of an electric vehicle, a vehicle repair technician, etc.) to repair or replace the first transistor 508, display the alert to a user, transmit the alert to a different controller, ECU, etc., than the controller 502, etc. In other examples, in addition to or alternative to generating the alert, the alert generator 590 can turn off the first transistor 508 or maintain the first transistor 508 in an off state to prevent an undesirable operating condition to occur in response to a failure of the first transistor 508. In response to generating the alert at block 812, control returns to block 802 to determine whether to request another measurement associated with the transistor.

FIG. 9 is a flowchart representative of an example process 900 that may be carried out while utilizing machine readable instructions that may be executed and/or hardware configured to implement the controller 502 of FIG. 5 to determine a drain-to-source voltage (VDS) of the transistor and/or compare the VDS to historical data. The process 900 of FIG. 9 can be used to implement block 806 of the process 800 of FIG. 8. The process 900 of FIG. 9 begins at block 902, at which the controller 502 determines whether a transistor has a low IDS and a high VGS. For example, the circuit interface 560 (FIG. 5) can obtain a first measurement from the gate driver 504 that corresponds to the IDS flowing through the first transistor 508. In other examples, the circuit interface 560 can obtain a second measurement from the gate driver 504 that corresponds to the VGS of the first transistor 508. In such examples, the data comparator 565 can determine whether the IDS is high or low based on the first measurement and whether the VGS is high or low based on the second measurement.

If, at block 902, the controller 502 determines that the transistor has a low IDS and a high VGS, then, at block 904, the controller 502 identifies the desaturation voltage as VDESAT1 and stores VDESAT1 as a historical data reference in memory. For example, the circuit interface 560 can store the desaturation voltage as VDESAT1 in the historical data 580 (FIG. 5). In response to identifying the desaturation voltage as VDESAT1 and storing VDESAT1 as a historical data reference at block 904, the process 900 of FIG. 9 returns to block 808 of the process 800 of FIG. 8 to estimate a remaining lifetime of the transistor based on the comparison.

If, at block 902, the controller 502 determines that the transistor does not have either a low IDS or a high VDS, control proceeds to block 906 to determine whether the transistor has a high IDS and a low VGS. For example, the data comparator 565 can determine whether the IDS is high or low based on the first measurement and whether the VGS is high or low based on the second measurement.

If, at block 906, the controller 502 determines that the transistor has a high IDS and a low VGS, then, at block 908, the controller 502 determines VDS2 based on identifying the desaturation voltage as VDESAT2. For example, the data comparator 565 can determine that the desaturation voltage of the first transistor 508 corresponds to VDESAT2 of the second case 720 of FIG. 7. In such examples, the data comparator 565 can determine VDS2 based on identifying the desaturation voltage as VDESAT2 as described above in connection with the examples of Equations (3) and/or (4).

At block 910, the controller 502 compares VDS2 to a previous VDS2. For example, the data comparator 565 can determine a difference between a first VDS2 and a second VDS2, where the second VDS2 is a degradation threshold stored in the baseline data 575 (FIG. 5). In other examples, the data comparator 565 can determine a difference between a first VDS2 and a second VDS2, where the second VDS2 was previously obtained and/or otherwise stored by the controller 502 in the historical data 580.

At block 912, the controller 502 determines a package degradation based on the comparison. For example, the data comparator 565 can determine a first health parameter indicative of package degradation of the first transistor 508 based on the difference between the first VDS2 and the second VDS2. In response to determining the package degradation based on the comparison at block 912, the process 900 of FIG. 9 returns to block 808 of the process 800 of FIG. 8 to estimate a remaining lifetime of the transistor based on the comparison.

If, at block 906, the controller 502 determines that the transistor does not have either a high IDS or a low VGS, control proceeds to block 914 to determine whether the transistor has a high IDS and a high VGS. For example, the data comparator 565 can determine whether the IDS is high or low based on the first measurement and whether the VGS is high or low based on the second measurement.

If, at block 914, the controller 502 determines that the transistor does not have a high IDS and a high VGS, the process 900 of FIG. 9 returns to block 808 of the process 800 of FIG. 8 to estimate a remaining lifetime of the transistor based on the comparison. If, at block 914, the controller 502 determines that the transistor has a high IDS and a high VGS, then, at block 916, the controller 502 determines VDS3 based on identifying the desaturation voltage as VDESAT3. For example, the data comparator 565 can determine that the desaturation voltage of the first transistor 508 corresponds to VDESAT3 of the third case 730 of FIG. 7. In such examples, the controller 502 can determine VDS3 based on identifying the desaturation voltage as VDESAT3 as described above in connection with the examples of Equations (5) and/or (6).

At block 918, the controller 502 compares VDS3 to a previous VDS3. For example, the data comparator 565 can determine a difference between a first VDS3 and a second VDS3, where the second VDS3 is a degradation threshold stored in the baseline data 575. In other examples, the data comparator 565 can determine a difference between a first VDS3 and a second VDS3, where the second VDS3 was previously obtained and/or otherwise stored by the controller 502 in the historical data 580.

At block 920, the controller 502 determines a die degradation and a package degradation based on the comparison. For example, the data comparator 565 can determine a second health parameter indicative of die degradation and package degradation of the first transistor 508 based on the difference between the first VDS3 and the second VDS3. In response to determining the die degradation and the package degradation based on the comparison at block 920, the process 900 of FIG. 9 returns to block 808 of the process 800 of FIG. 8 to estimate a remaining lifetime of the transistor based on the comparison.

From the foregoing, it will be appreciated that example systems, methods, apparatus, and articles of manufacture have been described for transistor health monitoring. The described systems, methods, apparatus, and articles of manufacture facilitate the sensing of a transistor to determine a current or instant health of the transistor or, in some examples, to determine a prognostic health of the transistor. The described systems, methods, apparatus, and articles of manufacture facilitate sensing of a transistor immune to manufacturing and/or temperature variations over time by obtaining a baseline desaturation voltage in response to the transistor having a low IDS and a high VGS. The described systems, methods, apparatus, and articles of manufacture can determine different types of degradation from the same measurements associated with a desaturation circuit coupled to the transistor. The described systems, methods, apparatus, and articles of manufacture analyzes different types of degradation based on negative current generated by a power converter or other rectifier circuit to achieve real-time monitoring as described herein. The described methods, apparatus and articles of manufacture improve the efficiency and reliability of using a computing device by determining a health and/or reliability of underlying transistors and generating an alert to repair, replace, or execute other mitigating or preventative measures in connection with a transistor of interest. The described methods, apparatus and articles of manufacture are accordingly directed to one or more improvement(s) in the functioning of a computer.

Example systems, methods, apparatus, systems, and articles of manufacture for transistor health monitoring are described herein. Further examples and combinations thereof include the following:

Example 1 includes a gate driver comprising a request receiver pin, a measurement transmitter pin, and a driver control logic pin, the request receiver pin, the measurement transmitter pin, and the driver control logic pin configured to be coupled to a controller, a sensing pin, the sensing pin to be coupled to a sensing circuit, a control logic circuit having an input coupled to the request receiver pin, a transistor coupled to the control logic circuit and the sensing pin, a multiplexer coupled to the control logic circuit and the sensing pin, an analog-to-digital converter (ADC) coupled to the multiplexer and the measurement transmitter pin, and a driver control logic circuit coupled to the driver control logic pin.

Example 2 includes the gate driver of example 1, wherein the ADC has an input and an output, the input is coupled to the multiplexer, the output is coupled to the measurement transmitter pin, and the ADC to be coupled to the controller via the measurement transmitter pin.

Example 3 includes the gate driver of example 1, further including a voltage input pin, and wherein the multiplexer has a first input, a second input, and an output, the first input is coupled to the control logic circuit, the second input is coupled to the sensing pin and the voltage input pin, and the multiplexer to be coupled to the sensing circuit via the sensing pin.

Example 4 includes the gate driver of example 3, wherein the transistor is a first transistor, and the sensing circuit includes a first diode having a first anode and a first cathode, the first cathode to be coupled to the sensing pin, a second diode having a second anode and a second cathode, the second cathode to be coupled to a second transistor, a capacitor having a first capacitor terminal and a second capacitor terminal, the first capacitor terminal coupled to the first cathode, the first capacitor terminal to be coupled to the sensing pin, the second capacitor terminal coupled to the first anode, and a resistor having a first resistor terminal and a second resistor terminal, the first resistor terminal coupled to the first cathode and the first capacitor terminal, the first resistor terminal to be coupled to the sensing pin, the second resistor terminal coupled to the second anode.

Example 5 includes the gate driver of example 1, further including a voltage input pin and a comparator having a first input, a second input, and an output, the first input coupled to the voltage input pin and the transistor, the second input coupled to a reference voltage input, and the output coupled to the control logic circuit.

Example 6 includes the gate driver of example 1, further including a voltage input pin, a sensing pin, and a comparator, and wherein the transistor is a N-channel metal-oxide-semiconductor field-effect transistor (MOSFET) having a gate and a current terminal, the gate coupled to the control logic circuit, the current terminal coupled to the voltage input pin, the sensing pin, and an input of the comparator.

Example 7 includes the gate driver of example 1, wherein the transistor is a first transistor, and further including a first pin, a second pin, and a third pin, the first through third pins coupled to the driver control logic circuit, the first through third pins to be coupled to a second transistor.

Example 8 includes a gate driver comprising a pin, a first transistor, a multiplexer, a control logic circuit coupled to the multiplexer and the first transistor, the control logic circuit configured to turn off the first transistor to bias a first diode of a desaturation circuit configured to be coupled to the multiplexer, the desaturation circuit to measure a first voltage associated with a second transistor in response to the biasing of the first diode, and an analog-to-digital converter (ADC) coupled to the multiplexer, the ADC to convert the first voltage to a digital output, the digital output to be obtained by a controller via the pin.

Example 9 includes the gate driver of example 8, wherein the control logic circuit measures the first voltage in response to a first request from a controller, and further including a driver control logic circuit to be coupled to the second transistor, the first request to be generated in response to the driver control logic circuit turning on the second transistor, and the control logic circuit configured to in response to obtaining a second request from the controller, turn off the first transistor to cause the desaturation circuit to generate a second voltage associated with the second transistor, the second request to be generated in response to the driver control logic circuit turning off the second transistor and a negative current flowing through a body diode of the second transistor, and instruct the multiplexer to send the second voltage to the ADC, the ADC to send the second voltage to the controller via the pin.

Example 10 includes the gate driver of example 8, wherein the control logic circuit measures the first voltage in response to a first request from a controller, and further including a driver control logic circuit to be coupled to the second transistor, the first request to be generated in response to the driver control logic circuit turning on the second transistor, and the control logic circuit configured to in response to obtaining a second request from the controller, turn off the first transistor to cause the desaturation circuit to generate a second voltage associated with the second transistor, the second request to be generated in response to the driver control logic circuit turning on the second transistor and a negative current flowing through a body diode of the second transistor, and instruct the multiplexer to send the second voltage to the ADC, the ADC to send the second voltage to the controller via the pin.

Example 11 includes the gate driver of example 8, wherein the second transistor is a silicon carbide (SiC) metal-oxide-semiconductor field-effect transistor (MOSFET), and further including a driver control logic circuit configured to control the SiC MOSFET.

Example 12 includes a system comprising a controller, a desaturation circuit including a diode, a transistor coupled to the desaturation circuit, and a gate driver coupled to the controller, the desaturation circuit, and the transistor, the gate driver configured to in response to a request from the controller, bias the diode to generate a first voltage associated with the transistor, and transmit the first voltage to the controller, and the controller configured to generate an alert indicative of a health parameter associated with the transistor based on a comparison of the first voltage to a second voltage, the second voltage generated by the desaturation circuit prior to the first voltage.

Example 13 includes the system of example 12, wherein the transistor is a first transistor, and the gate driver includes a second transistor, a multiplexer, a control logic circuit coupled to the multiplexer and the second transistor, an analog-to-digital converter (ADC) coupled to the multiplexer, and a driver control logic circuit coupled to the first transistor.

Example 14 includes the system of example 13, wherein the control logic circuit is configured to obtain the request from the controller, in response to obtaining the request from the controller, turn off the second transistor to bias the diode, and instruct the multiplexer to transmit the first voltage to the ADC, the ADC is to transmit the first voltage to the controller.

Example 15 includes the system of example 12, wherein the desaturation circuit includes a resistor coupled to the diode, the controller is configured to generate the request in response to the gate driver turning on the transistor, and the controller is configured to determine that the first voltage is based on a second voltage across the resistor and a third voltage across the diode.

Example 16 includes the system of example 12, wherein the transistor is a first transistor, the request is a first request, the controller is configured to generate the first request in response to the gate driver turning on the first transistor, the gate driver further includes a second transistor, and the gate driver is configured to turn off the first transistor to cause a negative current to flow through a body diode of the first transistor, and in response to obtaining a second request from the controller, turn off the second transistor to cause the desaturation circuit to generate a third voltage associated with the first transistor.

Example 17 includes the system of example 16, wherein the controller is configured to generate the second request in response to the gate driver turning off the second transistor and the negative current flowing through a body diode of the second transistor, and the controller is configured to in response to obtaining the second voltage from the gate driver, compare the third voltage to a fourth voltage, the fourth voltage generated by the desaturation circuit prior to the third voltage, and generate the alert in response to determining that a difference between the third voltage and the fourth voltage satisfies a threshold.

Example 18 includes the system of example 12, wherein the controller is configured to determine a first drain-to-source voltage of the transistor based on the first voltage, determine a second drain-to-source voltage of the transistor based on the second voltage, determine a difference between the first drain-to-source voltage and the second drain-to-source voltage, determine whether the difference meets a degradation threshold, and determine a health parameter indicative of at least one of a die degradation or a package degradation associated with the transistor in response to determining that the difference meets the degradation threshold.

Example 19 includes the system of example 18, wherein the controller is configured to determine that the health parameter is indicative of the package degradation in response to a gate-to-source voltage of the transistor meeting a threshold voltage, and determine that the health parameter is indicative of the die degradation and the package degradation in response to the gate-to-source voltage of the transistor not meeting the threshold voltage.

Example 20 includes the system of example 12, wherein the transistor is a silicon carbide (SiC) metal oxide semiconductor field-effect transistor (MOSFET). Example 21 includes a method comprising transmitting a request from a controller to a gate driver, the gate driver configured to obtain a first voltage associated with a first transistor, in response to the gate driver obtaining the request, turning off a second transistor included in the gate driver, measuring the first voltage with a desaturation circuit, the desaturation circuit coupled to the gate driver and the first transistor, determining, with the controller, a second voltage associated with the first transistor based on the first voltage, and in response to a difference between the second voltage and a third voltage satisfying a threshold, generating, with the controller, an alert indicative of a health parameter associated with the first transistor.

Example 22 includes the method of example 21, wherein the threshold is a first threshold, and further including determining a first value of a drain-to-source current associated with the first transistor, determining a second value of a gate-to-source voltage associated with the first transistor, in response to determining that the first value does not satisfy a second threshold and the second value satisfies a third threshold, determining that the second voltage is based on a voltage drop across the desaturation circuit, and storing the second voltage as the third voltage in memory.

Example 23 includes the method of example 22, further including, in response to determining that the first value satisfies the second threshold and the second value does not satisfy the third threshold determining that the second voltage is based on the voltage drop across the desaturation circuit and a drain-to-source voltage of the first transistor, and determining package degradation associated with the first transistor based on the difference between the second voltage and the third voltage.

Example 24 includes the method of example 22, further including, in response to determining that the first value satisfies the second threshold and the second value satisfies the third threshold determining that the second voltage is based on the voltage drop across the desaturation circuit and a drain-to-source voltage of the first transistor, and determining die degradation and package degradation associated with the first transistor based on the difference between the second voltage and the third voltage.

Example 25 includes the method of example 21, wherein the first transistor is a silicon carbide (SiC) transistor, the controller is an electronic control unit included in an electric vehicle, and the alert includes a message to replace the first transistor.

Although certain example systems, methods, apparatus and articles of manufacture have been described herein, the scope of coverage of this patent is not limited thereto. On the contrary, this patent covers all systems, methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. A gate driver comprising:
    a request receiver pin configured to be coupled to a controller;
    a measurement transmitter pin configured to be coupled to the controller;
    a driver control logic pin configured to be coupled to the controller;
    a sensing pin configured to be coupled to a sensing circuit;
    a control logic circuit having an input coupled to the request receiver pin;
    a transistor coupled to the control logic circuit and the sensing pin;
    a multiplexer having a first input coupled to the control logic circuit and a second input coupled to the sensing pin;
    an analog-to-digital converter (ADC) coupled to the multiplexer and the measurement transmitter pin; and
    a driver control logic circuit coupled to the driver control logic pin.

2. The gate driver of claim 1, wherein the ADC has an input and an output, the input is coupled to the multiplexer, the output is coupled to the measurement transmitter pin, and the ADC to be coupled to the controller via the measurement transmitter pin.

3. The gate driver of claim 1, further including a voltage input pin, and wherein the multiplexer has a first input, a second input, and an output, the first input is coupled to the control logic circuit, the second input is coupled to the sensing pin and the voltage input pin, and the multiplexer to be coupled to the sensing circuit via the sensing pin.

4. The gate driver of claim 3, wherein the transistor is a first transistor, and the sensing circuit includes:
    a first diode having a first anode and a first cathode, the first cathode to be coupled to the sensing pin;
    a second diode having a second anode and a second cathode, the second cathode to be coupled to a second transistor;
    a capacitor having a first capacitor terminal and a second capacitor terminal, the first capacitor terminal coupled to the first cathode, the first capacitor terminal to be coupled to the sensing pin, the second capacitor terminal coupled to the first anode; and
    a resistor having a first resistor terminal and a second resistor terminal, the first resistor terminal coupled to the first cathode and the first capacitor terminal, the first resistor terminal to be coupled to the sensing pin, the second resistor terminal coupled to the second anode.

5. The gate driver of claim 1, further including a voltage input pin and a comparator having a first input, a second input, and an output, the first input coupled to the voltage input pin and the transistor, the second input coupled to a reference voltage input, and the output coupled to the control logic circuit.

6. The gate driver of claim 1, further including a voltage input pin, a sensing pin, and a comparator, and wherein the transistor is a N-channel metal-oxide-semiconductor field-effect transistor (MOSFET) having a gate and a current terminal, the gate coupled to the control logic circuit, the current terminal coupled to the voltage input pin, the sensing pin, and an input of the comparator.

7. The gate driver of claim 1, wherein the transistor is a first transistor, and further including a first pin, a second pin, and a third pin, the first through third pins coupled to the driver control logic circuit, the first through third pins to be coupled to a second transistor.

8. A gate driver comprising:
    a pin adapted to be coupled to a controller;
    a first transistor;
    a multiplexer;
    a control logic circuit having a first output coupled to an input of the multiplexer and a second output coupled to the first transistor, the control logic circuit configured to turn off the first transistor to bias a first diode of a desaturation circuit configured to be coupled to the multiplexer, the desaturation circuit to measure a first voltage associated with a second transistor in response to the biasing of the first diode; and
    an analog-to-digital converter (ADC) coupled to the multiplexer, the ADC to convert the first voltage to a digital output, the digital output to be obtained by the controller via the pin.

9. The gate driver of claim 8, wherein the control logic circuit measures the first voltage in response to a first request from a controller, and further including:
    a driver control logic circuit to be coupled to the second transistor, the first request to be generated in response to the driver control logic circuit turning on the second transistor; and
    the control logic circuit configured to:
        in response to obtaining a second request from the controller, turn off the first transistor to cause the desaturation circuit to generate a second voltage associated with the second transistor, the second request to be generated in response to the driver control logic circuit turning off the second transistor and a negative current flowing through a body diode of the second transistor; and instruct the multiplexer to send the second voltage to the ADC, the ADC to send the second voltage to the controller via the pin.

10. The gate driver of claim 8, wherein the control logic circuit measures the first voltage in response to a first request from a controller, and further including:

a driver control logic circuit to be coupled to the second transistor, the first request to be generated in response to the driver control logic circuit turning on the second transistor; and the control logic circuit configured to:

in response to obtaining a second request from the controller, turn off the first transistor to cause the desaturation circuit to generate a second voltage associated with the second transistor, the second request to be generated in response to the driver control logic circuit turning on the second transistor and a negative current flowing through a body diode of the second transistor; and instruct the multiplexer to send the second voltage to the ADC, the ADC to send the second voltage to the controller via the pin.

11. The gate driver of claim 8, wherein the second transistor is a silicon carbide (SiC) metal-oxide-semiconductor field-effect transistor (MOSFET), and further including a driver control logic circuit configured to control the SiC MOSFET.

12. A system comprising:
a controller;
a desaturation circuit including a diode;
a transistor coupled to the desaturation circuit; and
a gate driver coupled to the controller, the desaturation circuit, and the transistor, the gate driver configured to:
in response to a request from the controller, bias the diode to generate a first voltage associated with the transistor; and
transmit the first voltage to the controller; and
the controller configured to generate an alert indicative of a health parameter associated with the transistor based on a comparison of the first voltage to a second voltage, the second voltage generated by the desaturation circuit prior to the first voltage.

13. The system of claim 12, wherein the transistor is a first transistor, and the gate driver includes:
a second transistor;
a multiplexer;
a control logic circuit coupled to the multiplexer and the second transistor;
an analog-to-digital converter (ADC) coupled to the multiplexer; and
a driver control logic circuit coupled to the first transistor.

14. The system of claim 13, wherein the control logic circuit is configured to:
obtain the request from the controller;
in response to obtaining the request from the controller, turn off the second transistor to bias the diode; and
instruct the multiplexer to transmit the first voltage to the ADC, the ADC is to transmit the first voltage to the controller.

15. The system of claim 12, wherein the desaturation circuit includes a resistor coupled to the diode, the controller is configured to generate the request in response to the gate driver turning on the transistor, and the controller is configured to determine that the first voltage is based on a second voltage across the resistor and a third voltage across the diode.

16. The system of claim 12, wherein the transistor is a first transistor, the request is a first request, the controller is configured to generate the first request in response to the gate driver turning on the first transistor, the gate driver further includes a second transistor, and the gate driver is configured to:

turn off the first transistor to cause a negative current to flow through a body diode of the first transistor; and in response to obtaining a second request from the controller, turn off the second transistor to cause the desaturation circuit to generate a third voltage associated with the first transistor.

17. The system of claim 16, wherein the controller is configured to generate the second request in response to the gate driver turning off the second transistor and the negative current flowing through a body diode of the second transistor, and the controller is configured to:

in response to obtaining the second voltage from the gate driver, compare the third voltage to a fourth voltage, the fourth voltage generated by the desaturation circuit prior to the third voltage; and generate the alert in response to determining that a difference between the third voltage and the fourth voltage satisfies a threshold.

18. The system of claim 12, wherein the controller is configured to:
determine a first drain-to-source voltage of the transistor based on the first voltage;
determine a second drain-to-source voltage of the transistor based on the second voltage;
determine a difference between the first drain-to-source voltage and the second drain-to-source voltage;
determine whether the difference meets a degradation threshold; and
determine a health parameter indicative of at least one of a die degradation or a package degradation associated with the transistor in response to determining that the difference meets the degradation threshold.

19. The system of claim 18, wherein the controller is configured to determine that the health parameter is indicative of the package degradation in response to a gate-to-source voltage of the transistor meeting a threshold voltage, and determine that the health parameter is indicative of the die degradation and the package degradation in response to the gate-to-source voltage of the transistor not meeting the threshold voltage.

20. The system of claim 12, wherein the transistor is a silicon carbide (SiC) metal oxide semiconductor field-effect transistor (MOSFET).

21. A method comprising:
transmitting a request from a controller to a gate driver, the gate driver configured to obtain a first voltage associated with a first transistor;
in response to the gate driver obtaining the request, turning off a second transistor included in the gate driver;
measuring the first voltage with a desaturation circuit, the desaturation circuit coupled to the gate driver and the first transistor;
determining, with the controller, a second voltage associated with the first transistor based on the first voltage; and
in response to a difference between the second voltage and a third voltage satisfying a threshold, generating, with the controller, an alert indicative of a health parameter associated with the first transistor.

22. The method of claim 21, wherein the threshold is a first threshold, and further including:

determining a first value of a drain-to-source current associated with the first transistor;

determining a second value of a gate-to-source voltage associated with the first transistor;

in response to determining that the first value does not satisfy a second threshold and the second value satisfies a third threshold, determining that the second voltage is based on a voltage drop across the desaturation circuit; and storing the second voltage as the third voltage in memory.

23. The method of claim 22, further including, in response to determining that the first value satisfies the second threshold and the second value does not satisfy the third threshold:

determining that the second voltage is based on the voltage drop across the desaturation circuit and a drain-to-source voltage of the first transistor; and determining package degradation associated with the first transistor based on the difference between the second voltage and the third voltage.

24. The method of claim 22, further including, in response to determining that the first value satisfies the second threshold and the second value satisfies the third threshold:

determining that the second voltage is based on the voltage drop across the desaturation circuit and a drain-to-source voltage of the first transistor; and determining die degradation and package degradation associated with the first transistor based on the difference between the second voltage and the third voltage.

25. The method of claim 21, wherein the first transistor is a silicon carbide (SiC) transistor, the controller is an electronic control unit included in an electric vehicle, and the alert includes a message to replace the first transistor.

* * * * *